US009088169B2

(12) United States Patent
Anderson

(10) Patent No.: US 9,088,169 B2
(45) Date of Patent: Jul. 21, 2015

(54) POWER-CONDITIONED SOLAR CHARGER FOR DIRECTLY COUPLING TO PORTABLE ELECTRONIC DEVICES

(71) Applicant: World Panel, Inc., Boulder, CO (US)

(72) Inventor: John Augustus Anderson, Superior, CO (US)

(73) Assignee: WORLD PANEL, INC., Boulder, CO (US)

( * ) Notice: Subject to any disclaimer, the term of this patent is extended or adjusted under 35 U.S.C. 154(b) by 190 days.

(21) Appl. No.: 13/832,025

(22) Filed: Mar. 15, 2013

(65) Prior Publication Data

US 2013/0305528 A1      Nov. 21, 2013

Related U.S. Application Data

(60) Provisional application No. 61/644,432, filed on May 9, 2012.

(51) Int. Cl.
| | |
|---|---|
| *H01R 43/00* | (2006.01) |
| *H02J 7/00* | (2006.01) |
| *H02J 7/35* | (2006.01) |
| *H01L 31/02* | (2006.01) |
| *H01L 31/0224* | (2006.01) |
| *H02S 30/10* | (2014.01) |
| *H02S 40/34* | (2014.01) |

(52) U.S. Cl.
CPC .............. *H02J 7/0052* (2013.01); *H01L 31/02* (2013.01); *H01L 31/022433* (2013.01); *H02J 7/35* (2013.01); *H02S 30/10* (2014.12); *H02S 40/34* (2014.12); *Y02E 10/50* (2013.01); *Y10T 29/49117* (2015.01)

(58) Field of Classification Search
CPC ..................................................... H02J 7/0014

USPC ............... 29/825, 592.1, 830, 831, 846–847; 320/101, 107, 113, 115; 429/10; 136/251, 244; 52/173.3; 438/61–62
See application file for complete search history.

(56) References Cited

U.S. PATENT DOCUMENTS

| | | | | |
|---|---|---|---|---|
| 7,514,900 | B2 * | 4/2009 | Sander et al. | ................. 320/101 |
| 8,220,210 | B2 * | 7/2012 | Botkin et al. | ................. 52/173.3 |
| 8,432,124 | B2 * | 4/2013 | Foster | ........................... 320/101 |

(Continued)

FOREIGN PATENT DOCUMENTS

JP          09-035397 A       2/1997

OTHER PUBLICATIONS

Nternational Searching Authority, Form PCT/ISA/237 for IA No. PCT/US2013/040223, Written Opinion of the International Search Authority, Aug. 29, 2013, Russia.

*Primary Examiner* — Minh Trinh
(74) *Attorney, Agent, or Firm* — Brainspark Associates, LLC

(57) ABSTRACT

The present invention relates to methods, tools and systems for manufacturing a durable and portable power-conditioned personal solar system charging apparatus. Various voltage and amperage matching algorithms are manipulated to particularize the personal solar system to power and/or charge an intended portable device or a set of intended portable devices having direct current (DC) load requirements. The optimized personal solar system that is matched to an intended device allows direct coupling to the intended device without the use of an internal battery or ancillary electronic circuit boards to distract the personal solar system output, and facilitates "fast" charging modes.

6 Claims, 31 Drawing Sheets

(56) References Cited

U.S. PATENT DOCUMENTS

| | | |
|---|---|---|
| 8,677,702 B2 * | 3/2014 | Jenkins .................... 52/173.3 |
| 8,748,212 B2 * | 6/2014 | Duncan et al. ................ 438/61 |
| 2008/0246443 A1 | 10/2008 | Doljack |
| 2009/0039827 A1 | 2/2009 | Fowler |
| 2010/0225273 A1 | 9/2010 | Eastlack |
| 2010/0319759 A1 | 12/2010 | Fisher et al. |
| 2013/0305528 A1 * | 11/2013 | Anderson ...................... 29/825 |
| 2014/0261636 A1 * | 9/2014 | Anderson .................... 136/251 |

* cited by examiner

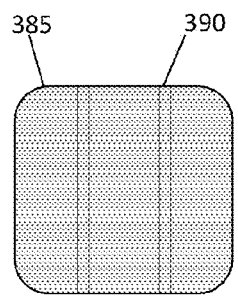
FIG. 13A
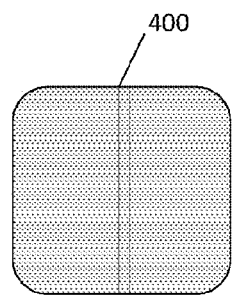
FIG. 13B
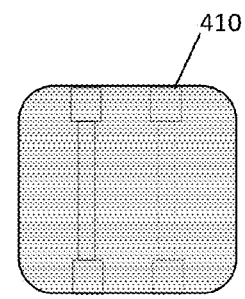
FIG. 13C
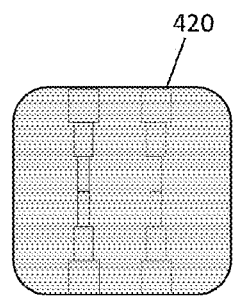
FIG. 13D
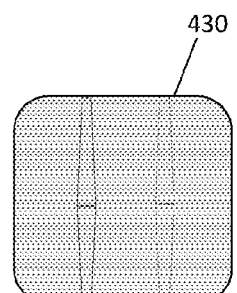
FIG. 13E
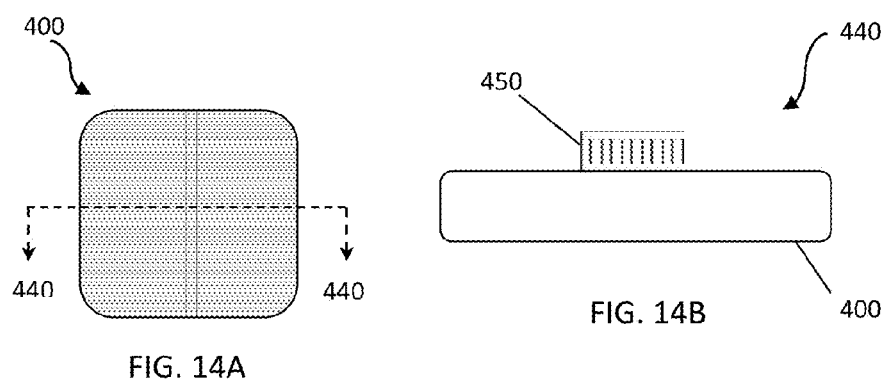
FIG. 14A
FIG. 14B

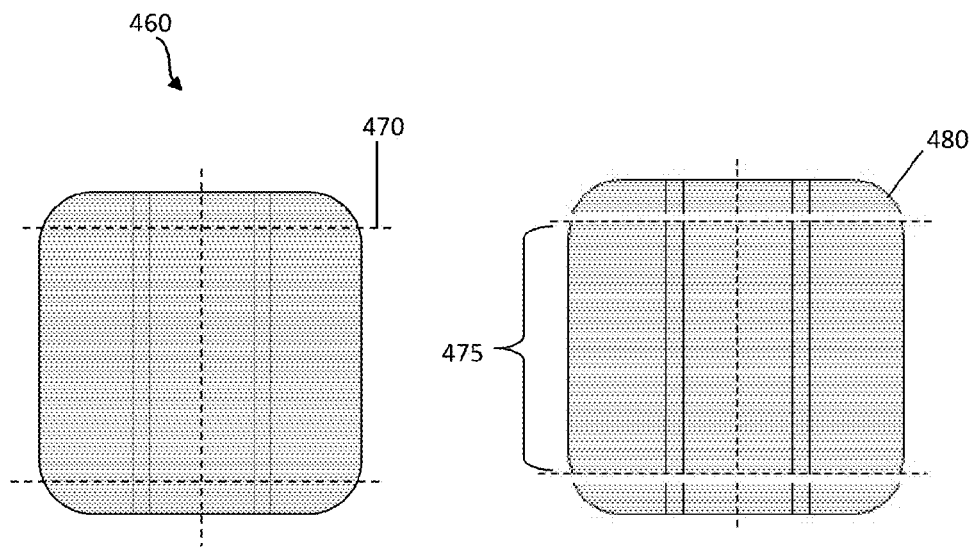
FIG. 15A
FIG. 15B
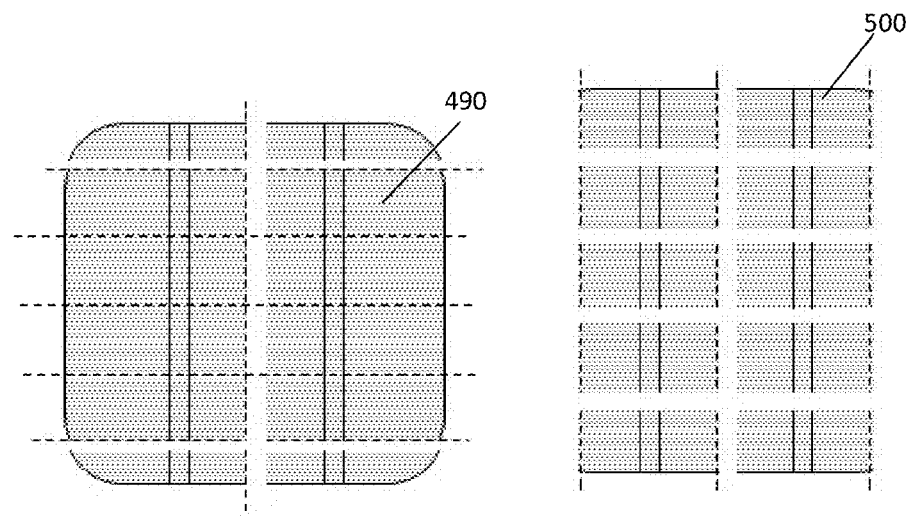
FIG. 15C
FIG. 15D

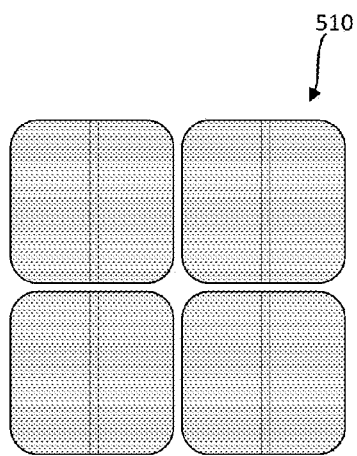 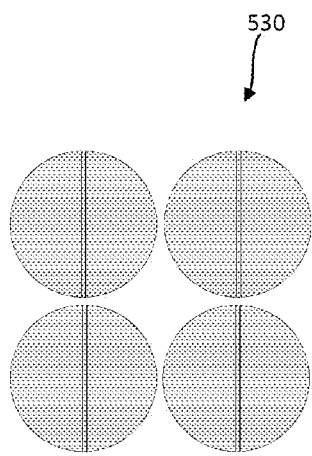 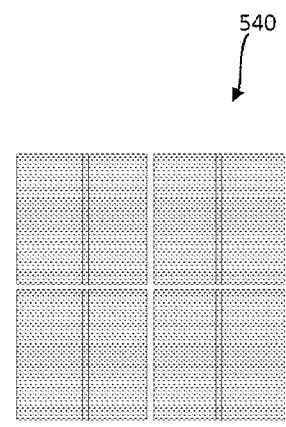
FIG. 16A FIG. 16B FIG. 16C
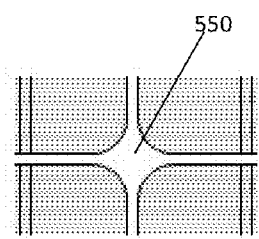 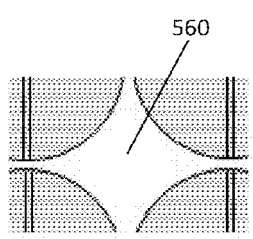 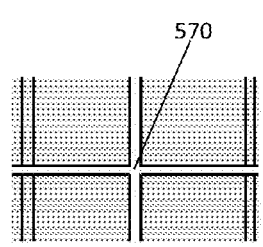
FIG. 17A FIG. 17B FIG. 17C

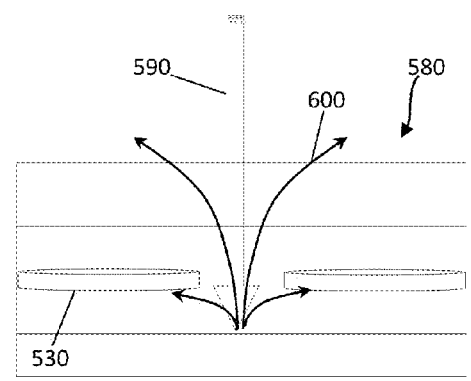
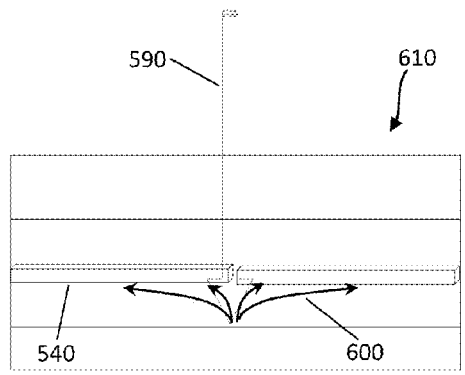
FIG. 18A  FIG. 18B
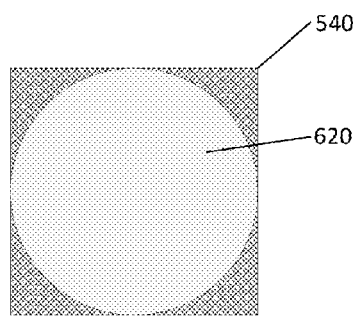
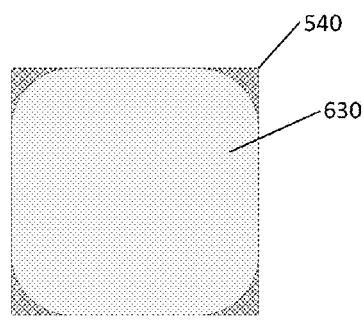
FIG. 19A  FIG. 19B
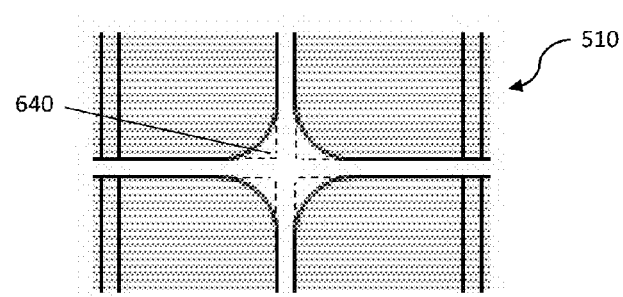
FIG. 20

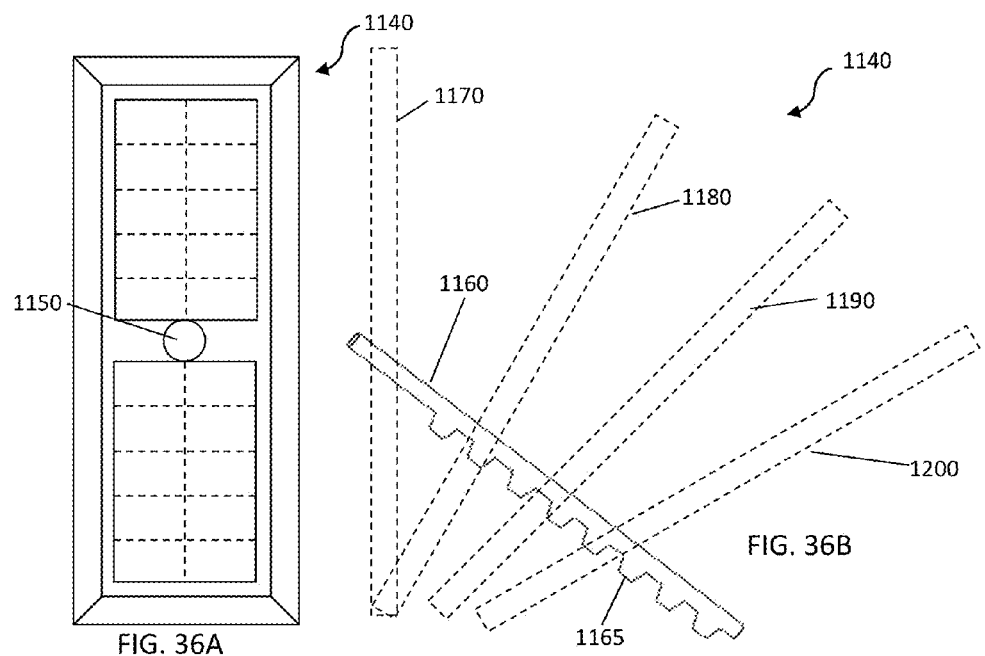
FIG. 36A
FIG. 36B
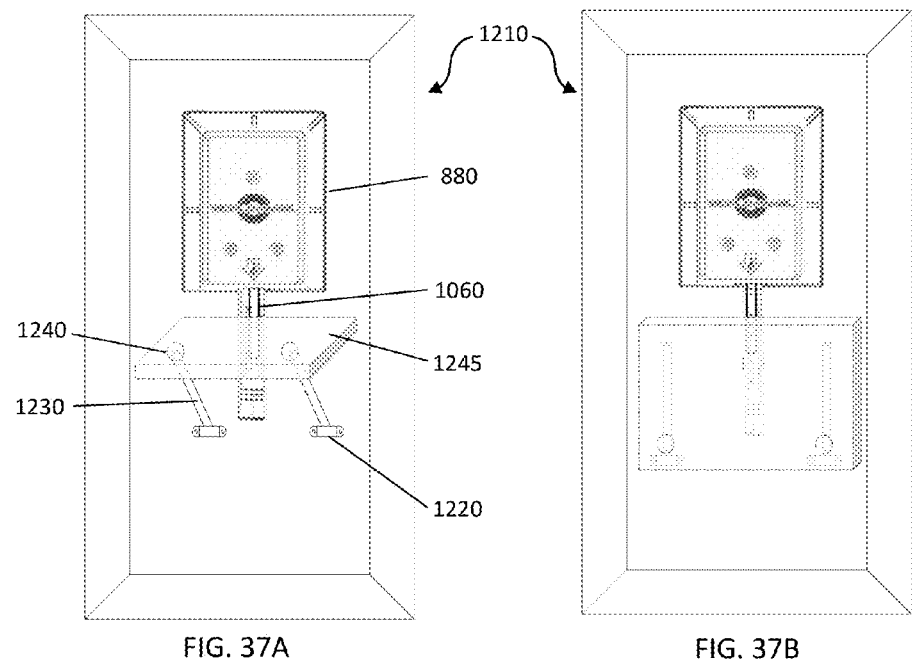
FIG. 37A
FIG. 37B

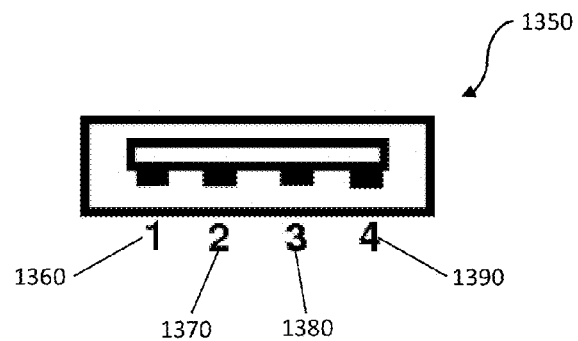
FIG. 40
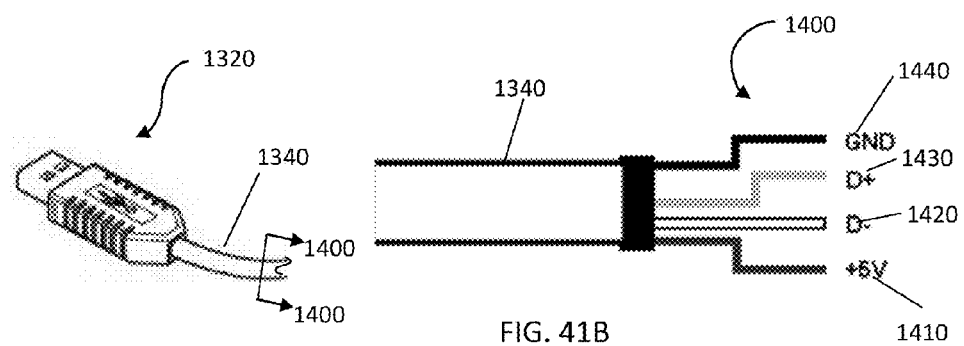
FIG. 41A
FIG. 41B
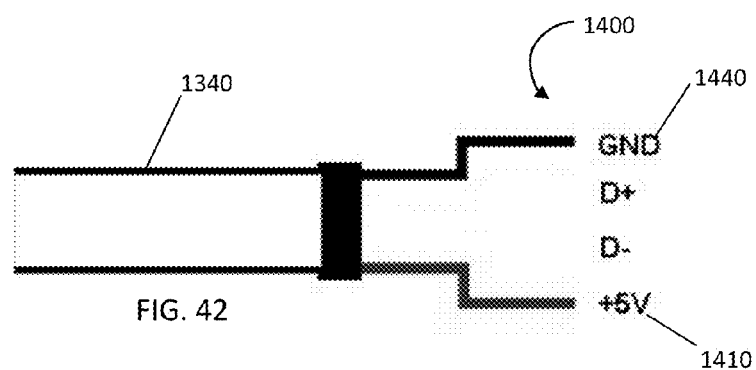
FIG. 42

POWER-CONDITIONED SOLAR CHARGER FOR DIRECTLY COUPLING TO PORTABLE ELECTRONIC DEVICES

RELATED APPLICATIONS

This application claims the benefit of U.S. Provisional Patent Application Ser. No. 61/644,432, entitled "Photovoltaic Solar Module with a Junction Box that Possesses a USB port(s) which are Replaceable," filed May 9, 2012, from which priority is claimed under 35 U.S.C. 119, and the disclosure of which is hereby incorporated herein by reference in its entirety.

TECHNICAL FIELD

The present invention relates to an improved personal solar cell recharging apparatus and system particularized for a desired loading environment of an intended device, and having an inexpensive, portable, and ruggedized construction. More specifically, methods, systems, and devices are disclosed for optimizing a solar array construction that requires no electronic power conditioning, is durable, is inexpensive, is portable, has a low cost of manufacturing, and may desirably provide for replaceable component parts such as USB junction boxes and USB connectors, to directly recharge batteries of intended devices having direct current (DC) load requirements.

BACKGROUND OF THE INVENTION

Solar cells or photovoltaic (PV) cells are devices that convert sunlight to electricity. Solar cells are typically manufactured from semiconductor materials, which may be doped with a variety of "impurities" to enhance the absorption of photons, increase conduction and/or reduce band gap energy of the cell (i.e., the amount of energy required to knock an electron loose). In various solar cell designs, when a photon reaches or "strikes" components of the PV cell, a certain portion of the photon or its energy is absorbed into the semiconductor material and "knocks" one or more electrons loose, allowing the electron(s) to flow more freely within the semiconductor matrix or lattice.

The "free flowing" electrons knocked loose by the photons can "en masse" produce an electric field that repels or otherwise forces the free electrons to flow in a certain direction, which when "collected," can produce a voltage and/or current. Metal contacts or other conductive structures can be placed on the opposing sides (i.e., top and bottom) of a PV cell to provide a flowpath for the electrons, resulting in a voltage and current that can be utilized for a variety of purposes, such as for providing power to rechargeable devices.

Each PV cell has specific operating characteristics that are dependent upon the current and the voltage produced by the solar cell. Depending upon the constituent components of the cell (i.e., the lattice material, dopants, other additives and/or construction of the cell), as well as the PV cell's shape and size, the operating characteristics produced by a given cell can vary significantly. In general, a cell of a given "type" will typically produce operating characteristics with a fixed (or "assumed") working or "nominal" voltage, a current, and indicated power calculated in watts. Assuming a cell with given operating characteristics at standard testing conditions (STC), therefore, it is possible to customize an array to provide the desired power required for a specific use. In various embodiments, PV cells can be connected together in various configurations (i.e., series, parallel and/or various combinations thereof) to form modules that provide a power output. If desired, multiple modules can be connected together to form complex PV arrays of different sizes and/or power outputs. Depending upon desired power requirements, the modules of an array can form a component part of a PV system, where the PV system is utilized to provide power for a variety of applications, such as recharging and/or powering devices. In general, traditional PV systems also include a wide variety of ancillary systems, such as auxiliary electrical connections, integrated mounting hardware, power-conditioning equipment, temperature regulating equipment, computers, circuits, inverters, charger controllers, and storage batteries that store solar energy for use when the sun is not shining and/or insufficient power is being generated to meet load requirements.

The power generated by PV arrays and equipment is generally more expensive than equivalent power from other sources due to the inclusion of auxiliary electrical systems. Moreover, the numerous ancillary systems and/or components necessary for use with typical PV systems impart significant additional disadvantages to such systems, which can include: (1) the ancillary equipment requires power and generates additional inefficiencies, which can reduce/de-rate and/or otherwise impact the useful power generated by the system for use by the consumer; (2) ancillary equipment can be expensive, and typically adds significant expense to the overall cost of the PV system; (3) ancillary equipment typically converts or generates a maximum output power for the system, which may have to be reconverted by subsequent equipment to be useful for a particular device (i.e., the PV power output is not "tailored or matched exactly" to the intended device); (4) depending upon the type of PV system, failed or malfunctioning ancillary components may be impossible to replace without dissembling or ruining the device, or their removal and/or replacement may require specialized equipment and/or technical training; (5) the ancillary equipment may not be available in rural or remote locations, or may be available at only a prohibitive cost; and (6) the operation of such ancillary equipment or associated electronics may be unreliable for a given desired application.

As a result, there exists a need for a simple, ruggedized, portable PV system that is tailored to power the intended device or portable device directly or recharge the batteries of intended devices or portable devices, such as a mobile phone, lights, radios, laptops, tablets, iPads, iPhones, cell phones, smart phones, digital cameras, personal data assistants, MP3 players, storage batteries or other devices, and that reduces or eliminates the need for additional ancillary equipment and/or electronics.

SUMMARY OF THE INVENTION

The inventions disclosed herein describe novel systems, devices, methods, and techniques that can be employed to design and manufacture stand-alone DC to DC solar-powered energy generating equipment for use by a consumer to power and/or recharge portable electronic or other devices. Such systems will desirably be inexpensive to manufacture using standard, commercially available solar cells, will be extremely durable for an extended period of time, will incorporate inexpensive, readily available and easily replaceable components and systems for elements within the system that may fail and/or become worn or damaged during use of the device, and will be particularized and/or personalized for specific operating characteristics for a device or class of devices using mathematical algorithms to obtain results conforming to desired voltage amperage ratios. In various exemplary embodiments, the various concepts and teachings herein can be used to design and build photovoltaic (PV) energy generation modules (i.e., personal solar systems) that are particularized to power or recharge one or more of a variety of popular electronic platforms or devices, including devices such as the iPod®, iPhone®, HTC/Droid@, Blackberry®, Palm®, iPad®, eReaders, Kindle, Samsung Note, laptops, game devices, personal media players, USB radios or virtually any other portable electronic device that can be charged using USB port through a standard wall-mounted or cigarette-lighter mounted charging device, including through a USB host.

In various embodiments, the personal solar system may be designed as a rugged and water resistant or waterproof system for use in a variety of locations and/or weather conditions, including outdoor events, camping, backpacking, in emergency situations, use at rural or remote locations, at various combinations thereof and/or any situation where power from traditional or non-solar sources is not readily available.

In various embodiments, the personal solar system will be designed and manufactured in a compact, lightweight, portable, durable, and/or low profile form. These features desirably allow the user or consumer to transport the personal solar system easily and more efficiently without sacrificing significant space and/or weight. The low profile design could allow a consumer to easily insert the device into backpacks or other bags, transport it on their bicycle or motor bike, or allow the consumer to place it on their back and carry it. In various embodiments, the low profile design could include a variety of carrying straps or connection arrangements to allow a person to easily transport the personal solar system in a desired manner.

In various embodiments, the personal solar system will be uniquely tailored to power or recharge a device and will be capable of "directly coupling" to the device by DC to DC physical conversion without the use of ancillary and/or peripheral power conditioning electronics such as integrated circuit boards. In various embodiments, the personal solar system will be designed to power or recharge a specific device by matching its specific operating requirements to the design of the client's device, or it could be designed to power or recharge a class or set of device types. In various alternative embodiments, the personal solar system could optionally provide for charging of additional battery packs for subsequent use with desired devices as a "fall-back" storage option to direct recharging of the device, with such batteries used to recharge and/or power a desired device after the sun has set and/or in conditions where the available sunlight is unable to produce enough voltage (or cannot produce a proper amount or quality of power) to power and/or recharge a device or set of devices.

In various embodiments, a personal solar system can be designed and manufactured such that it can include easily replaceable "elements" for replacing components of the system that are likely to fail and/or become damaged during the lifetime of the system. For example, the system may be designed to include a replaceable junction box and/or junction box components. The replaceability of such components may be particularly desirous in a PV system that may have a working life of over 25 years, while various other components of the system, such as the junction box and/or female USB connector, may have a significantly shorter working life, such as 5 years or less. Unlike standard systems that require disposal of a system after breakage of a critical component, the present system allows the user to quickly, easily and inexpensively extend the useful life of the personal solar system well beyond the useful life of typical portable PV systems. In various embodiments, the user can access and replace a variety of broken components or other elements of the system, as well as modify or adapt existing components to particularize the system for use with other compatible devices if the consumer changes or purchases a new device having differing operating requirements. The wide variety of replaceable elements, and the placement and connecting arrangements between the various elements of the system, may significantly extend the expected power output of the entire personal solar system. Also, various peripheral electronics and/or circuit boards have a limited lifespan, and their lifecycle is significantly shorter than the personal solar system embodiments disclosed herein, making it a high likelihood of a lifecycle mismatch between the electronic parts and the personal solar system. As a result, by eliminating the peripheral electronics and/or circuit boards from the personal solar system, the personal solar system's useful life will be extended.

In various alternative embodiments, certain features and/or elements of the system can be intentionally integrated and/or fixed into component assemblies to minimize the opportunity for wear and/or damage, or to prevent tampering and/or modification of the electronics in an undesirable manner.

In various embodiments, the personal solar system may be designed to include junction boxes or other connecting features that integrate one or more input connector ports. The junction box may have single, double or multiple connector ports or combinations thereof for charging multiple devices simultaneously (i.e. a plug-n-play user friendly personal "solar" system) that anyone can use to charge their devices. In one preferred embodiment, the personal solar system may be designed with at least one USB connector to power or recharge a set of devices.

In various embodiments, the design and manufacture of a personal solar PV system can include the use of specific algorithms and design methods for determining an optimal design and associated manufacturing, and/or assembly features for a PV system that can optimize the output voltage and/or current from the system. These algorithms may be manipulated to design a personal solar PV system that meets international charging specifications, such as the Battery Charging 1.2 Specification that breakdown the required specifications into mathematic formulas to facilitate the design of the PV system's output from a portable device or class of portable devices level to match the mathematical requests from the client. Desirably, stabilization can occur within acceptable voltage ranges as a solid state PV charging controller through de-rated and matched voltage and/or amperage output to ensure maximum acceptance of the PV system to recharge the client's intended device. The various optimization processes may include, but are not limited to, creation of a useful PV system using a minimum size and/or quantity of commercially-available PV cells, creation of a useful PV system having an overall minimum or optimal surface area, creation of a useful PV system that is "ruggedized" for use in a variety of challenging environments and/or climates, creation of a PV system that has an extended useful life due to its design and assembly, creation of a useful PV system that incorporates modular replaceable or repairable component or modules for replacing components of the system that is likely to fail or become damaged during normal use of the system, creation of an inexpensive PV system, creation of an inexpensive PV system that requires no additional electronic components other than the solar tiles themselves with connective wires, creation of a useful PV system that is easily manufactured, and/or other advantages described herein.

In various embodiments, the PV system described herein can include the use of a variety of antireflective coatings on the bus bars, use of anti-reflective coloring on the frame, assembly with tight packing densities, and/or any combination thereof. Any feature or combination of features described herein can be used to create a PV system that provides for optimized or particularized voltage and current output from the personal solar system.

In various embodiments, the personal solar PV system may include an interface particularly designed to interact with a "smart" phone battery. In many cases, smart phones and/or power supply systems can include communication features that provide for "recognition" of voltage sources or other communications of data to be transmitted to and/or from the smart phone and/or charging power source. Such Smart devices generally contain one or more secondary battery cells, an analog monitoring chip, a digital controller chip, various discrete diodes, transistors, passive components, and a redundant safety monitor chip. All are used to monitor voltage, current, and temperature of the cells and manage proper discharge and charging of the battery pack within desired safety limits per the BC 1.2 specifications. Depending upon the various limitations programmed into the powered device, as well as the data capabilities of the charging device, it may be desirous to selectively incorporate a Smart Phone Interface (SPI) into a PV system that may be able to communicate with specific devices that have additional "smart" electronics or bypass the communication to specifically recharge or power an intended device. The SPI may provide a "divided" or a "shorted" data signal that bypasses the charged device in some manner, or the SPI may provide for various regulation of the personal solar system DC voltage/amperage output and/or allowable power input to the device. Alternatively, the SPI may provide additional transmission of signals through dedicated data lines that are connected to the smart phone to facilitate the differentiation of various types of charging ports. The SPI may also provide a replacement for various sensors or other electronics that the device may require. The personal solar system could include the SPI as an independent peripheral electronic adaptor that allows a "plug-n-play" for devices with "smart" electronics and/or the SPI may be integrated within the personal solar system junction box or can be sold specifically for consumers that have devices with "smart" electronics.

Other aspects and advantages of the present invention will become apparent from the following detailed description which, when taken in conjunction with the drawings, illustrates by way of examples the various principles and structures of the invention.

BRIEF DESCRIPTION OF THE SEVERAL VIEWS OF THE DRAWINGS

FIGS. 13A-13E depict various embodiments of bus bar shapes that may be deposited onto a solar cell to optimize the performance of a solar cell;

FIGS. 14A-14B depict a front view and an enlarged cross-sectional view of an embodiment of a traditional solar cell that may have a finned, heat sink bus bar;

FIGS. 15A-15D depict a front view of a traditional solar cell undergoing a secondary cutting operation process to produce optimized solar cells based on voltage matched characteristics of an intended device;

FIGS. 16A-16C depict the packing density of various conventional solar cells with different configurations;

FIGS. 17A-17C depict an enlarged view of the packing densities of various conventional solar cells with different configurations as shown in FIGS. 16A-16C;

FIGS. 18A and 18B illustrate one exemplary embodiment of solar energy refracting from low and high packing densities;

FIGS. 19A and 19B illustrate the surface area loss when a conventional round solar cell of FIG. 16B and square-round solar cell of FIG. 16A is superimposed on a square solar cell of FIG. 16C;

FIG. 20 depicts an enlarged view of a square-round solar cell of FIG. 16A and potential calculation of the corner surface area that may be optimized when having a tight packing density;

FIGS. 36A and 36B depict the front view and side view of one embodiment of an optimized PV panel with a tiltable support rod;

FIGS. 37A and 37B depict the back view of one embodiment of an optimized PV panel with shelving;

FIG. 40 depict cross-sectional view of one embodiment of a USB connector of FIG. 39, and its voltage and data lines integrated within the USB connector;

FIG. 41A depicts one embodiment of the male USB connector of FIG. 39 with a portion of the cable;

FIG. 41B depicts a magnified view a portion of the USB connector cable of FIG. 41A with the wires that are integrated with the USB connector cable;

FIG. 42 depicts a magnified view of a portion of the USB connector cable exposing one embodiment of the wire arrangement for a "smart" phone interface of FIG. 39;

DETAILED DESCRIPTION OF THE INVENTION

The following description is presented to enable any person skilled in the art to make and use the invention. Various modifications to the embodiments described will be readily apparent to those skilled in the art, and the generic principles defined herein can be applied to other embodiments and applications without departing from the spirit and scope of the present invention as defined by the appended claims. Thus, the present invention is not intended to be limited to the embodiments shown, but is to be accorded the widest scope consistent with the principles and features disclose herein. To the extent necessary to achieve a complete understanding of the invention disclosed, the specification and drawings of all issued patents, patent publications, and patent applications cited in this application are incorporated herein by reference.

Traditional Solar Cell Manufacturing

There are a wide variety of methods to manufacture PV cells. In one exemplary description of solar cell manufacture, traditional crystalline silicon solar cells can be manufactured from raw silicon using a variety of techniques to produce solar cells. The starting material for cell production can include mono-crystalline silicon, c-Si, polycrystalline silicon, ribbon silicon and mono-like-multi silicon, or the cell can be manufactured as a "thin film" layer on an underlying substrate. During the manufacturing process, the manufacturer may choose to impregnate or dope the silicon with boron or other material to ensure that the silicon structure will bear a desired positive potential electrical orientation.

Figure 1:
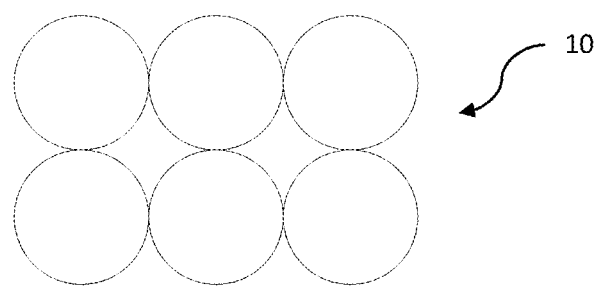
FIG. 1 depicts the top view of silicon ingots after crystallization.
Figure 2A:
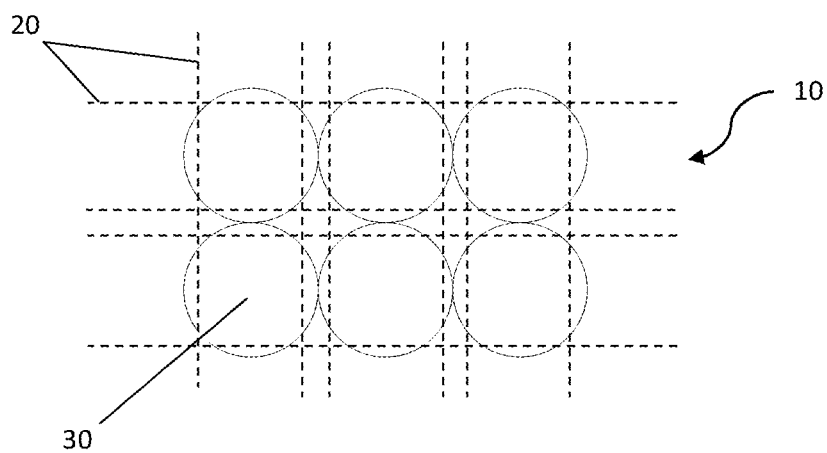
FIG. 2A depicts the top view of the cutting planes used to cut the silicon ingots to proper shape and size.
Figure 2B:
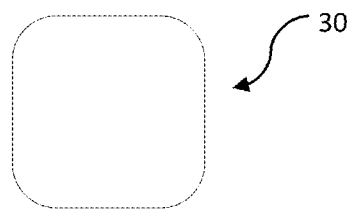
FIG. 2B depicts the top view of the resulting shape after the cutting operating of FIG. 2A.

For bulk-manufactured silicon, the manufacturing process can include a second step, wafering, which requires multiple passes of changing the shape (cutting, squaring, and slicing) of the silicon wafers prior to it being calibrated to form photovoltaic cells. Primarily, the silicon ingots 10 may require cutting or trimming of the top and bottom ends to achieve leveled, flat surfaces and to ensure that the silicon ingots 10 are all the same heights, such as shown in FIG. 1. Once the silicon ingots 10 ends are trimmed, they can be squared on four sides. In FIG. 2A, the silicon ingots 10 are placed standing on their flat ends in a rack to prepare for the wire slicing machine to slice each ingot into a lattice configuration 20, desirably leaving the silicon ingots 10 with a semi-square cross-section 30. The final shaping step can end with the slicing of each square-round ingot into multiple, thin square-round segments (i.e. wafers) 30 (see FIG. 2B) in preparation for converting the silicon wafers into solar cells.

A third manufacturing step involves the conversion of silicon wafers into solar cells by processing the wafers through a variety of intricate chemical and heat treatments, which converts the blank, grey wafers into productive, colored cells. Depending upon the manufacturing process and constituent materials used, the color of the cells can vary, but in many common commercially-available cells, the cell becomes a resulting blue color. The silicon wafer can next undergo texture etching to reveal the crystalline structure, which desirably increases absorption of the sunlight's photons by the cell, and they can be diffused with a phosphorus gas layer 35 (see FIG. 3), which produces the desired negative potential electrical orientation. The combination of the boron doping and the phosphorus diffusion in one typical cell-type creates a positive-negative junction, or P/N junction, that is critical to the operation of the solar cell. Finally, the cells can be coated with silicon nitride, which is an anti-reflective coating, which leaves the cells with their final dark blue color. Even with this last coating, the cell is not yet a fully-functional solar cell, as the cells still lack a mechanism to collect and forward the power generated therein.

Figure 3:
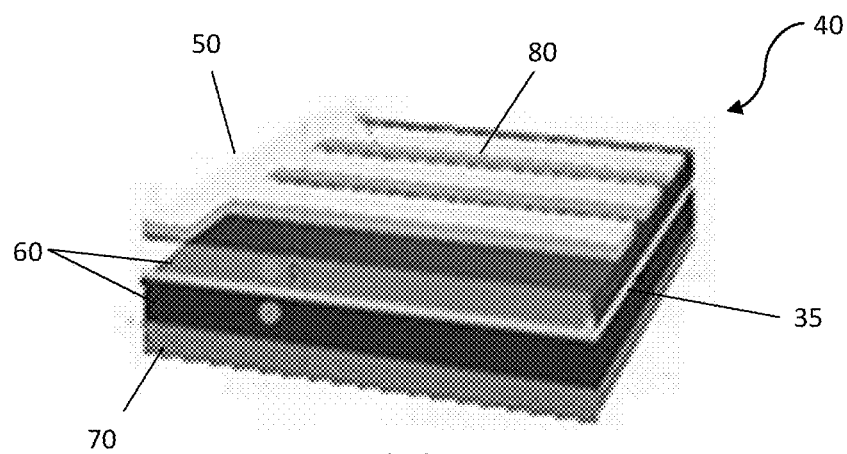
FIG. 3 depicts an enlarged isometric view of the layers composing a portion of a traditional solar cell.

In a typical cell, the manufacturer then prints or otherwise deposits thin metal strips or grids on both sides of the cell, depositing closely spaced, highly conductive aluminum or silver pin-stripe grid "fingers" 80 to collect the charge carriers generated in the silicon material as shown in FIG. 3. Because the grid material is typically opaque to the sun's rays, the manufacturer desirably keeps the grid finger width and/or overall printing coverage area to a minimum in order to keep shadowing losses low. The width and spacing between each of the grid fingers may be of concern to the manufacturer, as they may affect the electrical resistance if they are too small, may increase the emitter sheet resistance if they are too widely spaced, and will produce shading effects (if they are not transparent) that can affect solar cell efficiency. For example, shading of the grid fingers may decrease efficiency of the solar cell in that the amount of photon radiation contacting the cell surface (to be converted to electricity) must be reduced by the proportional total area of the cell covered by the grid fingers (which shade the cell from radiation in those locations), as compared to the overall cell size.

Figure 4:
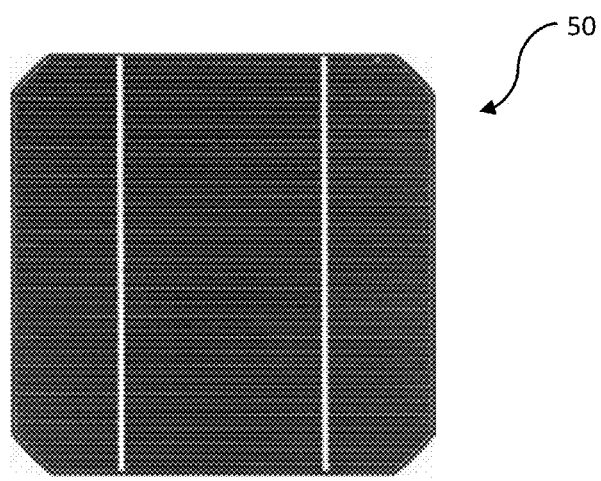
FIG. 4 depicts the front view of a fully manufactured traditional solar cell.

FIG. 3 further illustrates an exemplary manufacturing process for the deposition and/or assembly of bus bars 50 that collect the current from the grid fingers 80. Bus bars 50 are typically much wider and/or larger in cross-section than the grid fingers 80, (for example, at least 2 mm in width in some embodiments) which desirably enables them to transport current efficiently and to facilitate connection or "stringing" of the solar cells. Solar cell manufacturing can widely vary, but typical commercial solar cells are often manufactured with two or more bus bars (but additional bus bars may lead to an additional shading loss similar to the grid fingers). Once the fingers have been interconnected to the bus-bars, the solar cell becomes a fully functional energy-producing cell 40. In various additional embodiments, however, the solar cell will undergo additional processing such as the application of protective encapsulation layers to ensure durability of the cell and enhance the cell's productivity. Protective layers can include anti-reflective layers 60 and/or back surface contact layers 70. Once all of the encapsulation layers have been applied and/or embedded into the solar cell, the fully functional solar cell 50 (see FIG. 4) is ready for use.

Figure 5:
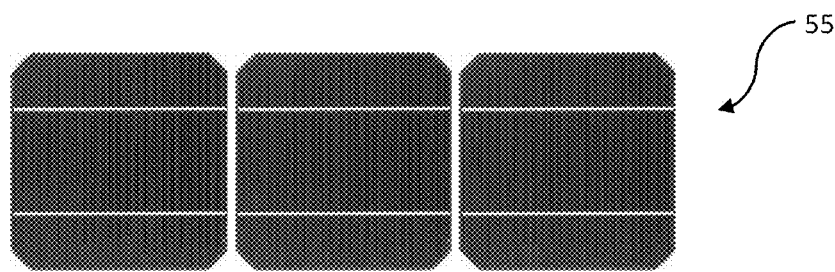
FIG. 5 depicts the front view of one embodiment of traditional solar cells in preparation for the stringing process.
Figure 6:
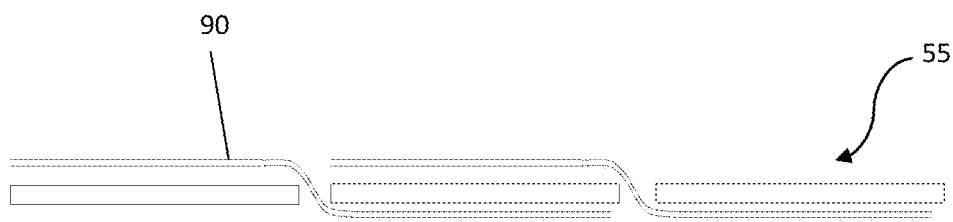
FIG. 6 depicts a side view of the traditional solar cells in FIG. 5 in preparation for bus bar tabbing process.

In a final step of solar module assembly, a series of fully functional solar cells 50 (see FIG. 4) can be strung together 55 (see FIG. 5). In one exemplary embodiment of solar cells attached in "series" or in "parallel," where the various tabs 90 can be soldered to each cell using an over-under-over-under pattern, such as that shown in FIG. 6, using conductive or metal connectors to link the cells, forming a module, array or matrix of cells.

Figure 7:
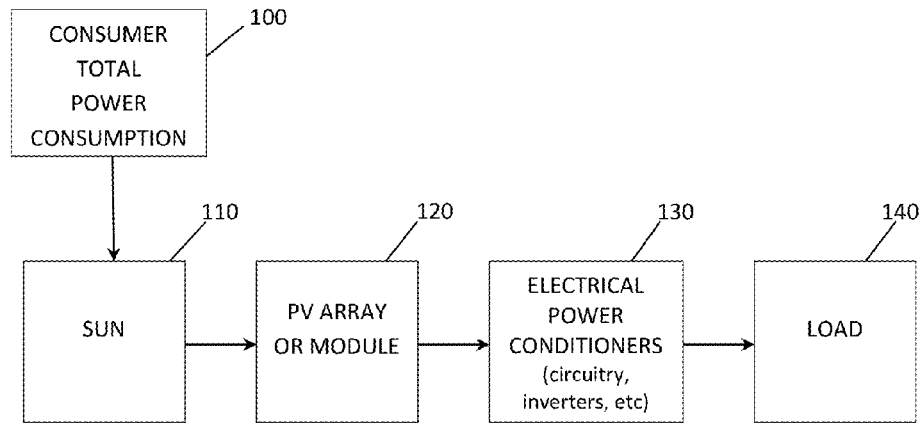
FIG. 7 illustrates a flow chart highlighting the traditional load matching decision-making process for installing a solar cell system to power a device.

FIG. 7 illustrates one embodiment of a flow chart that highlights one exemplary example of a traditional load matching decision-making process for designing, manufacturing and installing a solar power system to power multiple devices within a dwelling or home, such as lights, TV, refrigerator, and/or small electronic devices. Traditionally, the solar cell installer will calculate a yearly average power consumption 100 for the residence, which should include a calculation of the total number of solar days 110 (i.e., the amount of direct sunlight an installed solar panel or panels will receive each day) in the specific installation location. Furthermore, the installer will recommend a 20% safety factor addition to the system so that the system is capable of meeting "surge" demands and to compensate for variables in the power generation and load requirements, including such normal occurrences as cloudy days, etc. The system installer could then determine the total number of solar cells needed to provide the average power consumption for the consumer 140, and will direct the consumer to the commercially available PV module or array sizes that have the necessary predetermined power output characteristics 120 to meet the anticipated demand.

Once a solar array or module has been manufactured, the intention is to maximize watt power by increasing voltage or amperage, and to accomplish this, the traditional or conventional systems require ancillary equipment 130 attached to the PV array, which may include a junction box that connects to a computer, additional circuitry, and/or other equipment that "conditions" the power output from the solar panel in some manner. "Conditioning" or "electrical signal conditioning" devices can include a wide variety of devices and/or components that "smooth," modify, alter or otherwise electronically or mechanically transform the output voltage and/or current from the solar cell to a different quantity, such as raising or lowering the voltage/amperage of the output of the solar cell or cell array by a meaningful amount. "Conditioning" can also include the use of electronic systems and components such inverters, charge controllers, transformers, capacitors, diodes, transistors, amplifiers, or similar components, as well as mechanical conversion devices such as linked motors and generators that generate a desired voltage/current output from a different voltage/current input. Many systems also include a battery bank or other power-storage systems, to provide back-up or reservoir power to ensure that the consumer receives a desired power output level, regardless of the sun's intensity 150. All of these additional and/or ancillary components and systems add additional bulk to a PV system, and can add considerable expense as well. In addition, the increasing complexity of such systems can significantly reduce the system's reliability, as the failure of a single component can render the entire system unusable until repair and/or replacement is effectuated.

Particularizing or Optimizing a PV System to Recharge or Power an Intended Device One aspect of the present invention includes the realization that, when properly designed, manufactured and assembled, the power output of small PV power generating system can be directly coupled to sensitive portable electronic systems such as cell phones, electronic organizers, computers and/or other portable electronic devices to safely power and/or recharge in a quick and efficient manner. Various embodiments described herein include the optimization of a PV system by particularizing the design, manufacturing and assembly of the PV system to power or recharge devices or a class of devices without the use of electronic and/or mechanical power conditioning equipment or components, which significantly reduces the cost of components, manufacture, and assembly of the array. The absence of such electronic and/or mechanical power conditioning equipment or components further significantly increases the reliability and durability of such PV power generating arrays, as well as significantly increasing the percentage of generated power available for load consumption. In addition, by tailoring an individual PV system to match the intended device operating characteristics or class of devices, a PV array can be created for a minimum cost and a minimum size to meet the power needs of that specific system.

PV System Optimization by Physical Power Conditioning

While the design, use and commercialization of solar cells have become commonplace in our modern society, the use of solar cells in the industrialized world is often trivialized, treated as a convenience and/or considered a relative oddity. With the ready availability and low cost of centrally generated and distributed power from fossil fuels and/or hydroelectric sources, solar power is often viewed as a relatively expensive luxury for the vast majority of the industrialized world. However, where such power is not readily available, such as in less industrialized countries and/or during natural disasters and/or social upheaval, the use of solar power potentially shifts from a luxury to a necessity.

Even where they are manufactured in large quantities, solar cells are expensive. In many cases, the cost of the solar cells incorporated into a photovoltaic power source can greatly exceed the cost of the remaining components of the device. This cost, which translates into the ultimate cost of the photovoltaic power source, becomes an important consideration in a consumer's decision whether to use solar energy as an energy source to power and/or recharge devices. Where an acceptable photovoltaic power source for a given use can be constructed using a minimum number of solar cells, therefore, the resulting cost of such a power source is likely to be reduced.

Figure 8:
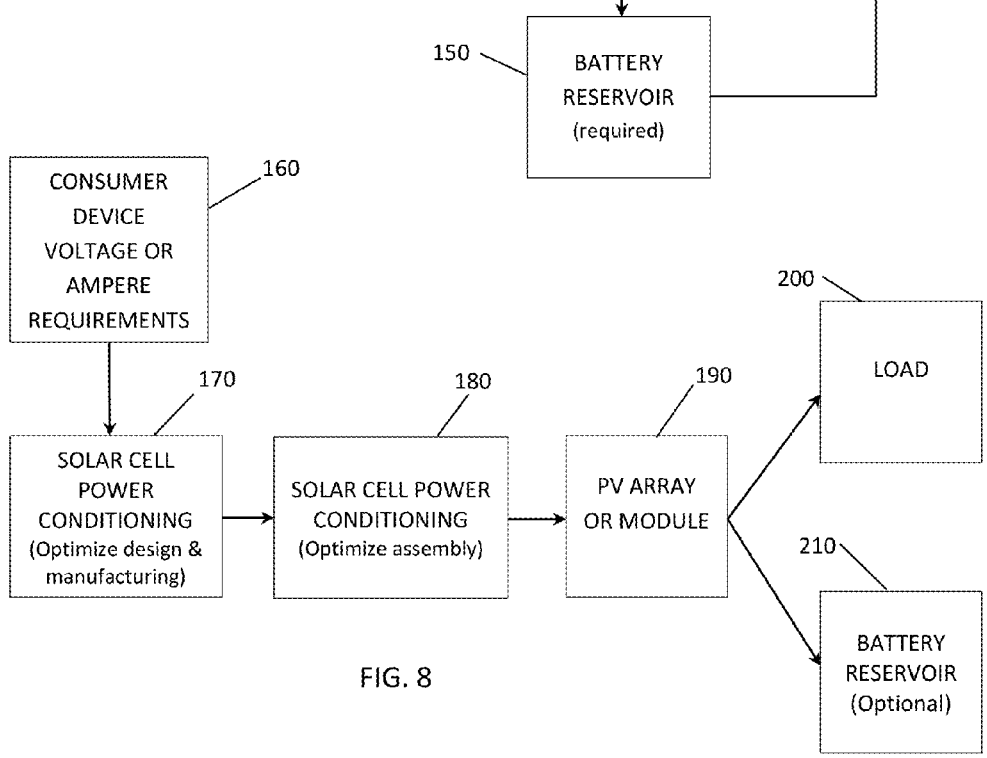
FIG. 8 illustrates a flow chart highlighting one alternative embodiment of using voltage-matching decision-making process to installing a solar cell system to power a device.

FIG. 8 illustrates a flow chart highlighting one exemplary embodiment of a design process for optimizing a PV system to power or recharge a specific device or class of devices by constructing the PV system with the minimum number of solar cells. In various embodiments, a manufacturer can use a voltage and amperage algorithm-matching decision-making process 160 to particularize the cell array design to a desired device operating characteristics, and then physically modify the component solar cells during the design and manufacturing 170 and/or during the assembly process 180 (or use existing solar cells of a desired dimension and/or other characteristics) to physically "condition" the output power from the PV module or array to match and/or approximate the desired load and/or operate within the load range). In various embodiments, the solar array will include a minimum number and/or size of solar cell to provide the desired operating characteristics, and the array will desirably be constructed in a minimally functional size and shape to render the array small, light and easily portable.

In a first step, a manufacturer or other designer (hereinafter, the "designer") will identify specific operating characteristics that the intended PV system must provide 160. Desirably, this will be a desired mathematical algorithm voltage range and mathematical algorithm desired amperage range to a specific electronic portable device, such as a cell phone, tablet, or smart phone. Because cell phones, tablets and smart phones generally carry on-board batteries and sensitive electronics, these devices also typically contain some form of charge regulating equipment or protective circuitry for controlling and/or regulating the power being accepted from the charging device also known as Universal Energy Management (UEM) systems. Each manufacturer typically specifies the battery or device operating conditions and incorporate electronics to prevent permanent damage to the battery and/or electronic systems of the device.

In various embodiments, an electronic protection circuit for a cell phone or other portable electronic device may use voltage ranges as a "cut-off" for acceptance of current from a charging device or also known as a host. In such a scheme, where an upper voltage limit of the threshold is exceeded, the system prevents current flow into the device. Similarly, where the voltage is below the lower threshold, current flow is blocked. Where voltage is maintained within the upper and lower limits, however, the scheme allows the device to accept current from the charging device and even expands the ranges of acceptance.

Figure 43:
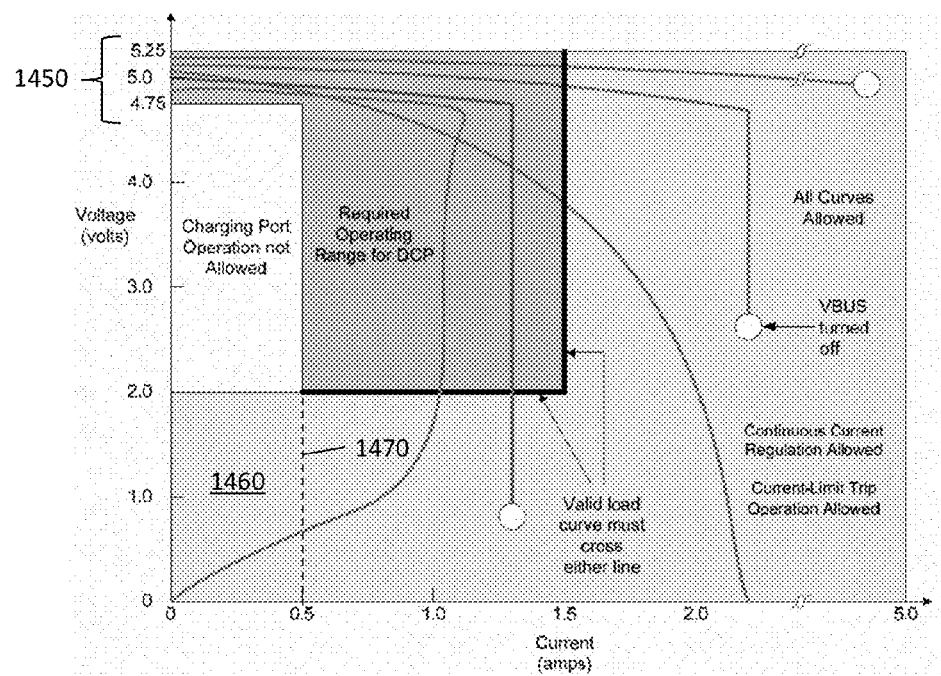
FIG. 43 illustrates a graphical representation of the dedicated charging ports operating characteristics for a class of devices.

FIG. 43 depicts a graphical representation of such an electronic protection circuit for a class of devices utilizing a standard Dedicated Charging Port (DCP) protection scheme in compliance with the BC 1.2 guidance document. In this graph, it can be seen that the DCP protection system may require the recognition of an initial voltage range 1450 of 4.75 to 5.25 volts from a power supply before the DCP will allow current flow into an attached device. If such a voltage is sensed, an initial current 1460 will be allowed to flow into the device, subject to continued monitoring by the device for various conditions. As current begins to increase (see bottom axis, in amps), the DCP monitoring system continually samples the voltage from the power supply, and if the voltage exceeds 5.25 volts, the system will cut off further current flow into the device. Similarly, if the voltage drops below 4.75 volts during the initial phase of charging (under 0.5 amps of current flow 1460), the DCP monitoring system will cut off further current flow into the device, unless the current flow has already exceeded 0.5 amps. Once 0.5 amps of current flow has been exceeded 1470, the DCP system allows further current flow to continue for any combination of voltages between 0 volts and 5.25 volts 1450, and for any combination of currents above 0.5 amps 1470. In addition, various combinations of lower voltage and amperage power are allowed by the system, such as supplied power between 0 to 2 volts and between 0 to 0.5 amps if desired. In this protection scheme, therefore, it is desirous that a power supply be designed to provide an initial voltage that is within the desired voltage ranges of the device, and with which the voltage does not drop below a minimum threshold voltage as current begins to flow until some secondary point in the protection scheme is reached that allows for wider variation in voltage and/or current (i.e., after 0.5 amps of current is being supplied) to allow further charging under less stringent monitoring conditions.

Desirably, the identified load range for the selected device will include identification and/or quantification of the various protection "schemes" or other charging power related factors. Where such loads and/or ranges are supplied by a device manufacturer, they may be used, although independent testing and/or confirmation of the accuracy of such ranges is highly recommended, as manufacturers often estimate or approximate such values based on device designs and design templates, and "real world" results can vary widely.

In various exemplary embodiments, a designer will identify a charging protection scheme, such as graphically depicted in FIG. 43, and specifically identify the various voltage and/or amperage operating range limits that must be closely matched to the device to accept dedicated charging from a PV system (i.e., the "optimized power" conditions). In addition, the operating range limits that exceed or do not meet the identified voltage/amperage operating range limits 1450 should be quantified to tailor the PV system from unexpectedly and/or permanently operating in the unwanted ranges. Desirably, the identified operating characteristics range can facilitate the design and construction of a PV system to generate sufficient power to meet the "identified" operating conditions required by the protection scheme, and subsequently enables shifting within a desired range to allow further charging of the device in ideal and less than ideal conditions.

In a next step, the designer will utilize the identified operating characteristics range of the intended device or class of devices, and desirably design and manufacture 170, and assemble 180 a PV system 190 that physically optimizes each solar cell (see FIG. 7). In one exemplary embodiment, the designer may desirably identify or select an inexpensive, commercially available solar cell. The identity and composition of the solar cell can vary, and the specific type and/or available dimensions of the solar cell can significantly affect the design process. The useable voltage from solar cells typically depends on the semiconductor material. In silicon, it amounts to approximately 0.5 volts, while in gallium arsenide, it can be as high as 0.9 volts. In general, commercially-available solar cells will be of some form of silicon (as they are the most common commercially-manufactured cell type), and thus the value for silicon will be utilized herein. Of course, the use of various solar cell types of different useable voltages is contemplated herein. In the exemplary embodiment, a mono crystalline 6" solar cell having 2 bus bars is selected, which is commercially available from a solar cell wafer manufacturer named Microsol, located in the Fujairah Freezone of Fujairah, UAE. Pertinent voltage and amperage characteristics of the 6" monocrystalline solar cell were Vmpp=0.520 volts, $V_{open\ circuit}$=0.612 volts, and $I_{mpp}$=8.083 amps and $I_{short\ circuit}$=8.580 amps under standard testing conditions (STC).

Once the inexpensive, commercially available cell is selected, the designer may undergo a variety of mathematical calculations and other considerations that optimizes the design and manufacturing, and assembly of the PV system to produce the identified voltage and/or amperage algorithm operating characteristics of an intended device for safely recharging or powering the device or class of devices. The optimization of the design, manufacturing and assembly of a PV system may include quantifying the minimum number of solar cells needed to match the identified voltage and amperage operating ranges, manipulating a commercially available cell into the proper cell configuration, assembling the PV system with a desired packing density, and minimizing or preventing resistive and thermal losses by integrating a wide variety of protective features (i.e., using reflective tape and white polymer frame). The physical optimization of the PV system allows the PV system to communicate mathematically with an intended device effectively because it outputs the proper identified voltage and amperage algorithm operating ranges, and allows the PV system to be directly coupled to the intended device or devices 200 in an electronic segment, industry, classification or other sectors that include these types of devices. Although the mathematical algorithms used to design the optimized PV panel may be sufficient to recharge and/or power a batter or an intended device, it may be advantageous to include a battery reservoir system if consumers desire this additional feature 210.

Device Voltage Matching and Cell Design

Once the load range and any charging protection "schemes" are identified and/or quantified, this information can be used to initially identify a desired "cell quantity." The designer will first identify the upper ($V_{max}$) and lower ($V_{min}$) voltages that the intended device protection scheme (UEM) will recognize and allow to "turn on" or accept the voltage from the host charging device. This voltage range is first used to determine the number of solar cells of the chosen type that can be connected to create a working voltage that falls within the $V_{max}$-$V_{min}$ range. For example, the protection scheme shown in FIG. 43 requires an expected initial voltage range of 4.75 volts ($V_{min}$) to 5.25 volts ($V_{max}$) for a class of devices to commence charging. Using the typical operating characteristic numbers for the Microsol solar cells previously identified, the open circuit voltage ($V_{oc}$) is 0.612 volts and the working voltage ($V_{mpp}$) is 0.520 volts under STC. Calculating the number of solar cells required to be strung together in series of this type to reach between 4.75 and 5.25 volts is as follows:

$$\frac{\text{Upper voltage limit}}{\text{Voltage max }(STC)} = \frac{5.25}{0.520} = 10.096$$

$$\frac{\text{Upper voltage limit}}{\text{Voltage max }(STC)} = \frac{4.75}{0.520} = 9.13$$

Using this calculation indicates that 10 solar cells of the desired type can desirably be used to create a desired voltage matched circuit. Specifically, the use of 10 cells of the specified type would create an array having a working output voltage of 10×0.520 volts or 5.20 volts.

A similar calculation can be used to determine if the open circuit voltage can be matched to fall within the $V_{max}$ and $V_{min}$ range.

$$\frac{\text{Upper voltage limit}}{\text{Cell open circ voltage}} = \frac{5.25}{0.612} = 8.578$$

$$\frac{\text{Upper voltage limit}}{\text{Cell open circ voltage}} = \frac{4.75}{0.612} = 7.761$$

Using this calculation method, therefore, the use of 8 cells of the specified type would desirably create an open circuit voltage of 8 multiplied by 0.612 to obtain 4.90 volts.

Desirably, both the working voltage and the open circuit voltage, when determined using the desired number of cells, will fall within the desired range voltage of the intended device. This would allow the open circuit voltage to "activate" the charging function of the protection scheme within the intended device and the working voltage to maintain the charging function. However, of the two calculations, the working voltage of the intended device may be more critical, and thus if both an open circuit voltage and a working voltage cannot be obtained within the desired range, it is preferred that the working circuit cell voltage ($V_{mpp}$) be optimized to maintain within the $V_{max}$ and $V_{min}$ range. In such a design, it may be necessary to shadow or "wake up" (shadowing the PV system with a hand, shade or other object for a moment, shading the sunlight, and then removing the object) the PV system for a short period of time when initially connected to the intended device due to a higher open circuit voltage ($V_{oc}$), which desirably downrates the $V_{oc}$ output of the PV array to more closely match the desired $V_{mpp}$ output, allowing the lowered $V_{oc}$ to activate the protection scheme and which causes a load on the host triggering Vmax conformity and allow current flow (which then brings the voltage to the $V_{mpp}$ level at a consistent level to maintain connection, which may be desirable). Furthermore, increased surface temperature on the solar array drags (i.e. thermal drag) down both the Voc and Vmax levels, which can fall below the optimal range as seen in FIG. 43 to activate the device. The "waking up" method may be used to supercede the thermal drag by assisting in the reactivation of the mathematical algorithm to signal and trigger the client's intended device protection scheme. In some instances, it may be desirable to have the small PV power generating system warming up in direct sun light to potentially control the operational characteristics.

Figure 10:
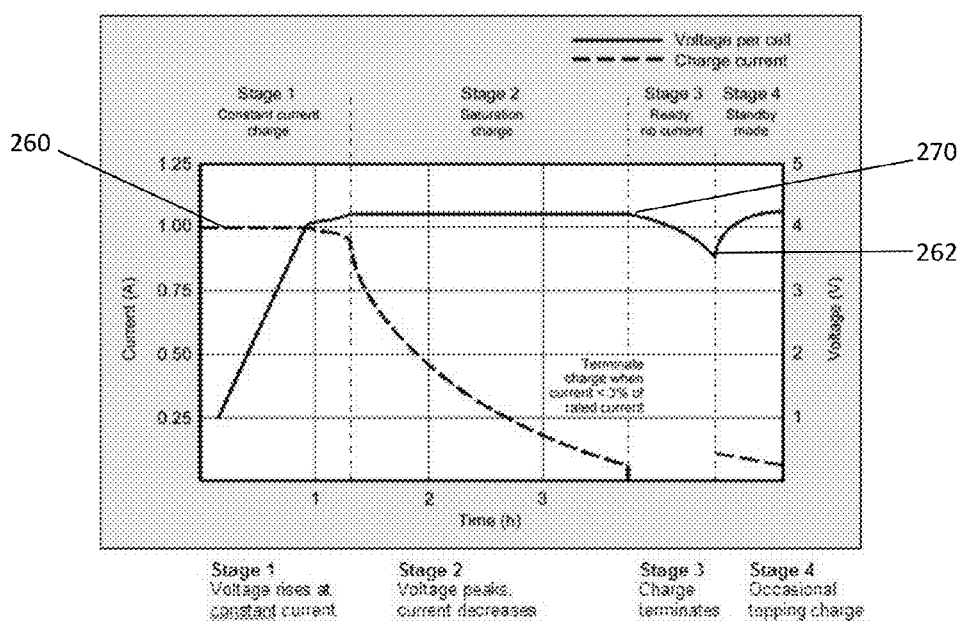
FIG. 10 depicts a graphical representation of the voltage and current discharge behavior that may be experienced by a rechargeable battery of FIG. 9.
Figure 11:
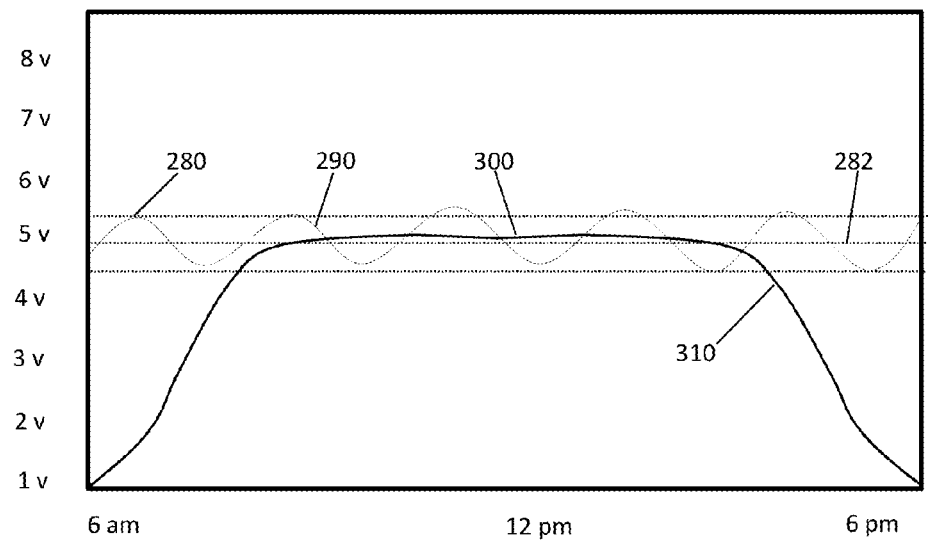
FIG. 11 depicts a graphical representation of the voltage behavior of a solar cell throughout the day superimposed over actual voltage output from one embodiment of a traditional rechargeable battery.

FIG. 11 depicts a graphical representation of the voltage behavior of a solar cell throughout the day superimposed over voltage output operating range for one embodiment of a traditional rechargeable battery. As previously discussed, an intended device rechargeable battery may experience an operating voltage range 290 during a charging cycle, varying between a maximum charging voltage 280, a minimum charging voltage 310, and a mean voltage level 282. It may be desirous to compare the operating voltage range of the intended device or battery with the optimized, conditioned or physically conditioned solar cells that may be strung together to form a PV module. Both the open circuit voltage ($V_{oc}$) (not shown) and/or the working circuit cell voltage ($V_{mpp}$) 310 of the PV system may be collected throughout the day, and it may be desirous plot the data in a graph as shown in FIG. 11. Furthermore, the operating voltage range 290 of the intended device may be plotted on the same graph to verify that the optimized PV system is producing the proper voltage in various weather conditions. The graphical confirmation of the operating voltage behavior of the optimized PV system throughout the day, and the operating voltage range for charging the intended device, may assist the designer with further changes or solar cell optimization. Alternatively, the designer may elect to design an optimized PV system to prevent charging at a lower rate than the battery discharges (see FIG. 10). It is desirable to provide the intended device a higher matched voltage and amperage range to exceed the operating discharge rates in order to fully and successfully recharge the intended device.

Since the operating voltage characteristics of the intended device or class of devices can be important in optimizing the PV system, it may be advantageous to accurately collect this data. In one embodiment, the consumer or manufacturer may decide to refer to the device manufacturer or supplier operating manuals of the product to acquire the specific voltage range. Also, in an alternative embodiment, the consumer or manufacturer may consider measuring and collecting independent data points of the magnitude operating voltage range, current and power during the consumer's life cycle or use of the device, such as operating performance under standard conditions, varying consumer's usage and behavior or climate conditions under which the batteries are exposed by using standard equipment known in the industry. Detecting or matching the voltage during specified life cycles may assist with deciphering the power control features of the device, which may include alternative power ranges to allow for various charging modalities, such as fast charging, slow charging and/or trickle charging of a device.

Device Amperage Matching and Cell Design

Figure 9:
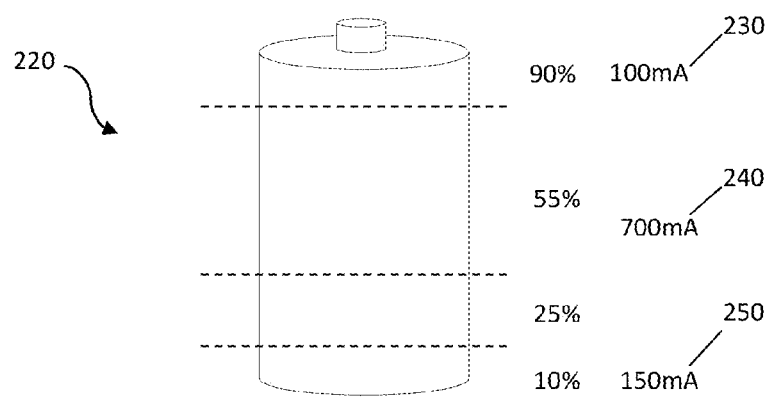
FIG. 9 depicts a traditional rechargeable battery and the current that may be required to recharge at its total percentage capacity.

Once a desired number of cells for the prospective PV system is determined, it is also desirous to determine an optimal amperage level or range for the device load. For small, portable electronics such as cell phones and other devices, the maximum charge current allowed to be accepted by such devices is generally small, and may vary during recharging as shown in FIG. 9. In one embodiment, the triggering current for a class of mobile phones that will accept a dedicated charging port (DCP) input amperage may begin at 500 milliamps (see FIG. 43) and may extend up to 1.5 amps, which can easily be supplied by the optimized PV arrays contemplated herein. In many cases, an optimized PV system can be constructed that charges a mobile phone at the same speed as a wall or car outlet, but which uses an optimized PV system fueled by the sun with DC to DC conversion algorithms to accomplish this feat.

In one exemplary embodiment, a mobile phone current of 800 milliamps may be desired to recharge a battery to achieve a "fast charge" mode. The PV system may be optimized to obtain this desired amperage of the mobile phone by identifying a relationship between the amperage and the surface area (sq. in) of a selected solar cell. For example, a 6 in.×6 in. (15.24 cm×15.24 cm) Microsol solar cell, selected herein, is rated at $I_{mpp}$=8.083 amps and $I_{short\ circuit}$=8.580 amps. A Microsol solar cell can be considered to have a 36 sq. in. surface area (or it may converted into 232.26 sq. cm.). The current per unit area may be calculated as 0.2245 in. sq. (0.0379 amps/cm$^2$). Once the current per unit area has been determined, an optimized surface area calculation for a given solar cell to obtain 800 milliamps can be performed. The optimized surface area can be calculated by dividing the desired input amperage of the intended device by the current per unit area of a selected solar cell. The optimized total surface area required to obtain the intended 800 milliamps means that 800 milliamps would be divided by the current per unit area 0.2245 in. sq (0.0379 amps/cm$^2$). This calculates to an estimated optimized total surface area of 3.5635 sq. in. (21.1082 cm$^2$) for a single solar cell, tile and/or subcell to obtain the desired 800 mA output for the intended device.

The optimized surface area calculation may be further used to estimate a quantity of optimized cut cells (also known as "tiles") desired to obtain both 800 milliamps and the desired working voltage of the intended device and battery. In one exemplary embodiment, the quantity of optimized cut cells are determined for the useable surface area of a commercially available Microsol solar cell. The quantity of optimized cut solar cells could be obtained by dividing one exemplary "useable optimized surface area" cutting scheme for a Microsol cell (which can be obtained by cutting the "corners" off the cell body, reducing the surface area of the cell by 16.5%) with a surface area of 30.0699 sq. in. (194.688 cm$^2$) by the optimized total surface area of 3.5635 sq. in. (21.1082 cm$^2$) per estimated cell or, producing a potential total of 8.438 cut cells, or rounded to 8 cut cells that are optimized for production from the Microsol cell to match the intended device's needs. Furthermore, optimizing the 8 cut solar cells and multiplying by the STC Vmpp=0.520 volts of the solar cell produces a total of 4.16 volts in the optimized array design. Desirably, the amperage algorithm may be used to cut or design any shape that can match the optimized or standard calculated current per unit area. Alternatively, the same approach may be used to create a set of optimized manufacturing requirements for a solar cell and array that are particularized to a specific device or class of devices, and these requirements may be presented to a device or solar cell manufacturer for custom manufacturing of the desired solar cells and/or PV arrays in an optimal manner.

In various alternative embodiments, the voltage and amperage matching processes described herein can produce an optimized PV cell output that may require additional optimization or correction factors that could increase or decrease the various output characteristics of the solar array. Such factors could be due to a wide variety of anticipated and/or unanticipated conditions, such as temperature, weather, solar incidence angle, cell array positioning, age of array and cell degradation, UV degradation and/or variance in material characteristics, as well as many others. Additional correction factors may also be introduced into the system that could require increasing the expected operating characteristics or power output by multiplying the values with correction factors, such as pseudo corner optimization, irradiance safety factors, packing density, thermal conductors and other factors that could potentially alter the output of the PV array, and which should be accounted for by the designer in the various calculation to maintain the voltage and amperage outputs within the desired range.

Solar Cell Design & Manufacturing—Power Conditioning During Crystal Growing

In various embodiments, voltage and ampere matching may be used as inputs to tailor or customize the design, manufacture and assembly of a solar cell for use in the creation of a unique PV module or array that can be directly coupled to an intended device, instead of using inexpensive, commercially available solar cells to design, manufacture and/or assemble a PV system. Such processes will desirably result in a PV module or array having power outputs particularized for a specific load, with the array having been "physically power conditioned" such that the need for external peripheral circuits and/or accessories (including electronic power conditioning components) is unnecessary between the PV generating modules and the electronic device. The various voltage and ampere matching input ranges may be accommodated during one or more of the following design and manufacturing processes, (i.e., crystal growing, wafering, solar cell production) to potentially improve power output, increase voltage requirements, increase solar efficiency, increase charge time, decrease traditional system losses, and reduce the cost of a solar panel system.

In one exemplary embodiment, a designer may use the voltage or ampere matching input ranges to select appropriate dopants on a custom-manufactured solar cell to achieve a specified band gap (i.e. different materials may absorb photons at varying energies). Silicon can be doped in a way during the crystal growing process that allows it to increase its conductivity, such as using a polycrystalline silicon. In alternative embodiments, silicon crystals may be doped with a variety of other materials, including amorphous silicon (which has no crystalline structure), graphene, gallium arsenide, silicon carbide, copper indium diselenide, xenon, arsenic, and cadmium telluride to change the voltage band gap of a solar cell.

In other embodiments, a designer may use the voltage or ampere matching input ranges to manufacture or grow multi-layer crystals of different materials to obtain different band gaps at different layers within the solar cell. By stacking higher band gap material on the surface to absorb high-energy photons while allowing lower-energy photons to be absorbed by the lower band gap material beneath, much higher efficiencies can result. Such cells may be called multi-junction cells, and may provide for higher and more consistent voltage output, and increased solar efficiencies.

In other embodiments, a designer may use the voltage and ampere matching input ranges to select the penetration depth of the dopant within the solar cell. Traditionally, the n-dopants are mixed during the crystallization process, where the silicon crystal lattice may act as "speed bumps" to slow down the collisions with silicon atoms. This slow method provides an uncontrolled doping method and allows the dopants to be mostly placed interstitially. Controlling penetration depth may achieve a more uniform silicon wafer and produce a more efficient solar cell. The control of penetration depth of dopants may be achieved by using ion implantation technology. Ionized particles may be accelerated and will have enough kinetic energy to penetrate the wafer upon impact. Therefore, penetration depth, channeling or concentrated placement of the dopants may improve efficiency of a solar cell. However, ion implant plantation may add cost to the overall cost per wafer because of the additional processes and equipment involved.

While custom cell manufacturers may particularize cells for a unique use or environment, the excessive cost of such custom manufacture may not lend itself to manufacture of inexpensive PV systems. However, should it be advantageous for a designer (i.e. inexpensive or does not change the cost sufficiently), the designer may consider implementing any of the previous embodiments.

Solar Cell Design & Manufacturing—Power Conditioning During Wafering

The wafering process of a solar cell alters and modifies the silicon ingot shape to the precise calibrated wafers that form the foundation of photovoltaic cells. In this step, the silicon ingots may undergo cutting of the ends, squaring of the ingots and slicing into thin wafers. In commercially-available cells, this process is what gives the traditional solar cell its specific shape (see FIG. 4). The features and characteristics of solar cells formed or shaped by commercial methods may be desired as a custom process. In one alternative embodiment, a designer may use the voltage and ampere matched input ranges and the optimized surface area calculations to commission a manufacturer to custom cut uniform square or rectangular configurations of the ingots during the process of squaring of the ingots, rather than producing the traditional square round shape. Desirably, a rectangular or square shape format will be chosen for each subcell or tile, although any shape that allows a tight packing density (i.e., minimize spacing between each solar cell while preventing undesired cell to cell contact) when assembling PV modules can be utilized. A square, rectangular or otherwise densely packable shape can result in an increased solar energy absorption, lower resistive losses between the cells, and an increased energy conversion per unit area due to an increased processed solar cell surface area per unit area of cell coverage in the array structure. While custom cell manufacturers may particularize the size and shape of each solar cell to match the intended device, the excessive cost of such custom manufacture may not lend itself to manufacture of inexpensive PV arrays. However, should it be advantageous for a designer (i.e. inexpensive or does not change the cost sufficiently), the designer may consider implementing any of the previous embodiments.

In one embodiment, a designer may desire to use the voltage and ampere matching calculations of the intended device or battery to create a plurality of "subcells" or "tiles" (smaller individualized uniform cells from a larger solar cell) from an inexpensive, commercially available solar cell. Desirably, each subcell or tile on a PV system may be optimized to the proper optimized surface area to produce the relevant energy-generating characteristics of the intended device.

One preferred embodiment of acquiring such subcells may be accomplished by undergoing a secondary cutting process to cut a single inexpensive commercially available solar cell into a series of individual uniform solar subcells, with each subcell having a similar finger and busbar arrangement on its face and having similar height and width characteristics as each other subcell (see FIG. 15A-15D) Desirably, the resulting number of such subcells in the PV array will desirably produce voltage in a desired range, and each of the subcells in the array with have a cross-sectional area sufficient to generate a desired amperage.

FIGS. 15A-15D depict a front view of a traditional solar cell 460 undergoing the secondary cutting process of cutting a commercially available solar cell into sub cells to produce optimized solar subcells based on voltage and amperage matched algorithms operating characteristics of an intended device. In FIG. 15A, the cutting process may begin by obtaining a traditional square-round solar cell 460 to prepare it for removing the square-round edges 470 and create subcells. The next step as shown in FIG. 15B, may desirably require the removal of the excess peripheral material that may contain poorly processed and/unfinished sections as well as any rounded edges 480, leaving straight edged pieces, each of the subcells having a desired length 475. In the exemplary embodiment, the sub-cutting operation of FIG. 15C demonstrates a further sub-cutting operation to a desired widths 490, or other variety of sizes and/or shapes as specified by the designer. FIG. 15D shows the resulting solar cell shapes or tiles 500 that, when strung in series in the proper number of cells, may produce the desired voltage and/or amperage to meet the matched input ranges of the intended device.

For example, using the selected Microsol solar cell, the presence of two, spaced-apart main bus bars allows the larger cell to be vertically sectioned into two equal sized portions, and then the individual portions can be horizontally sectioned into 4 equal pieces of 31.2 mm each, with an upper and lower "scrap" portion of 15.6 mm removed due to the rounded corners of the cell (which can be discarded, recycled or used for a different solar array design). This cutting strategy will create 8 equally sized cells from a single larger Microsol cell, and two such large solar cells can be sectioned to create 16 smaller cells of equal size and shape. By creating such smaller cells in this manner, the resulting smaller cells have a dimension of 7.8 cm×31.2 mm, which is a solar cell that can create a current of 7.8×31.2×0.034516765 amps/cm$^2$ or 840 milliamps, which slightly exceeds the desired load of previously identified embodiments. Once the cells have been designed and cut, and a proper number of such cells is available, the array can begin to be assembled.

The designer may elect a variety of standard methods and techniques available in the industry to perform the secondary cutting process of a commercially available cell. In one embodiment, once a desired size and shape for the subcells has been determined (i.e. the proportional surface area of each subcell has been calculated), the designer may undergo this sub-cutting process, as well as further cutting the shape into a rectangle, hexagon, or other shapes that allow tight packing during module assembly. The sub-cutting process may be performed by a variety of techniques, such as laser cutting, water cutting, laser scribing, "cold" laser, plasma etching, and mechanical scribing with manual cleavage. These sub-cutting processes will desirably provide high precision cuts to the subcells, produce superior surface quality, and desirably reduce the creation of any micro crack edges that could contribute to power loss in the solar cell or create shunts that reduce the overall subcell's and/or PV array's efficiency.

In one exemplary embodiment, the secondary cutting process for creating uniform subcells from a commercial solar cell may provide for an increase in power output per subcell. The increase in power output is derived from cutting or cleaving away edge portions of commercially available solar cells while manufacturing the individual uniform subcells, to increase the overall efficiency and power generated per unit area of each subcell. A commercially available solar cell usually has inherent design issues associated with each solar cell because the edges and/or corners of the cells can include areas of the cell that are only partially manufactured and/or are otherwise nonfunctional portions of the cell. As a result, using the secondary cutting process to cut commercially available solar cell into subcells allows the designer to use the functional surface area of the solar cell to assemble an optimized PV system. In one exemplary embodiment, the increase in power per subcell surface area can provide a total gain in power output per unit area of the subcell of 4% to 5%. This will be described hereinafter as "psuedo corner optimization."

For example, using the selected Microsol solar cell voltage calculation, the Vmax is 0.520 volts and string in a series of 9 subcells equals a Voc 4.68 volts, which is below the protection scheme of various voltage limiting electronics, resulting in the current being blocked. However, when adding the increased power subcell algorithm gain of approximately 4% nominal, the additional gain increases Vmax by 0.19 volts, which mathematically results in a Vmax equaling 4.87 volts (a "power conditioned" Vmax). The power conditioned Vmax then triggers the client's intended device to recognize the PV power generating system as a dedicated charge port (DCP) and opens the circuit. When the Voc is mathematically multiplied with the tile or subcell amperage of 800 mA, the resulting PV system charger is mathematically determined to be 3.8 watts.

It should be understood that, in various embodiments, one objective of the present invention can include the efficient and cost effective use of available larger solar cells to create multi-cell PV arrays, and thus the cutting of such larger cells will desirably be accomplished in a cost-effective manner. In such a case, where a given amperage requirement creates a need for an unusual cell size, and cutting of this size results in significant wastage of the remaining cell structure, it may be desirous to modify the amperage requirements to some degree to optimize the cell cutting strategy. For example, if an amperage requirement desired cells that could provide 700 milliamps of power, but the most efficient cutting arrangement produced cells having 800 milliamps (and the 700 milliamp cell design wasted significant silicon in the cutting process), it might be more efficient and cost-effective to create the 800 milliamp panel for the desired load. Similarly, if a higher amperage requirement was desired, it might be advantageous to create a system providing slightly lower amperage output to maximize price efficiency and minimize cell wastage.

Solar Cell Design & Manufacturing—Power Conditioning of Grid Pattern and/or Electrical Contacts In various alternative embodiments, it may be advantageous to use the voltage and ampere matching input ranges to customize or modify a design of the grid finger pattern and/or the bus bars of a solar cell. The bus bars are usually flat and larger, and the grid fingers are smaller, which branch off and attach to the bus bars. The grid fingers and the bus bars are typically necessary for cell electron transport, and they account for a variety of power losses in the cell, principally due to the quantity, size, and spacing of such items that tend to "shade" various areas of the solar cell. The losses that a non-optimized grid finger or bus bar design may cause to a cell can include optical losses caused by the screen-printed grid covering the cell surface (shading), the resistive losses due to lateral current flow in the N+ emitter (boron layer) of the cell, and basic resistive losses in the fingers and bus bars themselves. Because shading can often be the greatest contributor to cell power losses, the more surface area that the grid fingers and bus bars encompass, the more losses the solar cell exhibits, which can significantly affect the solar cell voltage and/or amperage in a variety of ways.

Figure 12A:
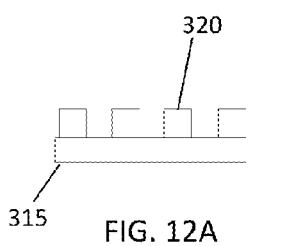
FIGS. 12A-12F depict an enlarged side view of various embodiments of grid finger shapes and heights that may be deposited on a solar cell to optimize the performance of a solar cell.

FIGS. 12A-12F depict various embodiments of grid finger shapes, spacings, and heights that may be optimized, which may include custom design using ampere and/or voltage matching input ranges. FIG. 12A represents a side view of one embodiment of a conventional square solar cell configuration 315 with standard size and spacing of the grid fingers 320. Typically, such standard size and spacing of the grid fingers may account for a large portion of the total surface area of a solar cell. As previously noted, such a large surface area covered by the grid fingers results in "shading," where the screen-printed grid covering the cell surface affects the voltage and amperage of a solar cell.

Figure 12B:
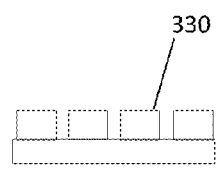
Figure 12C:
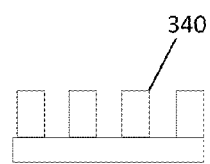
Figure 12D:
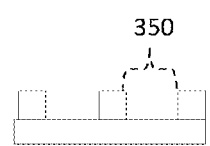

In one embodiment, the customer may request the manufacturer to deposit or print wider grid fingers 330 onto the solar cells as shown in FIG. 12B), which could help maintain lower line resistance and carry more electrons through the system, but such designs could also create excessive shading. Alternatively, the customer may request the deposition or printing of thinner or more narrow grid fingers 340 as shown in FIG. 12C onto the solar cell to decrease surface shadowing, but such actions may increase the line resistance within the conductive grid. Taller grid fingers may collect more current and supply it to the bus bars, but such designs may create some additional line resistance. In other embodiments, the consumer may be able to adjust the spacing 350 between standard sized grid fingers to reduce shadowing and the line resistance (see FIG. 12D).

Figure 12E:
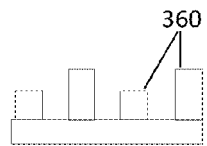
Figure 12F:
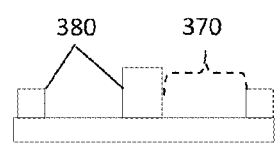

In various other embodiments, a manufacturer may be requested to create a hybrid of shorter or taller grid fingers 360 to help balance line resistance in the solar cell as shown in FIG. 12E. Other shapes may be contemplated, such as triangles, tapered configurations, rectangles with other shapes integrated within, etc (not shown). However, it may be desirable to combine many of the different features of the grid finger design, taller, shorter 380, spaced at different widths 370 (see FIG. 12F) to optimize voltage and current of a solar cell.

In various alternative embodiments, a customized bus bar design can be used to reduce the losses that the solar cell may experience. The bus bar may be optimized to reduce losses, increase efficiency, and reduce resistance. As shown in FIGS. 13A and 13B, the consumer may decide to change the design of the standard or traditional bus bar layout (see FIG. 13A) with a single bus bar design (see FIG. 13B) during manufacturing. Two bus bars adds the line resistance to the total solar cell as well as contribute to shadowing, but also facilitates the cutting of the cell into two equal halves along a centerline cut (which may be desirous). Should the solar cell be designed with only 1 bus bar, the shadowing of the system relative to the solar cell size would decrease, and proportionally decrease line resistance, and increase voltage and power, and cutting of the cell into two equal halves along a vertical centerline might be precluded by this design selection. FIGS. 13A-13E depict various embodiments of exemplary bus bar shapes that may be deposited onto a solar cell to optimize the voltage and amperage of a solar cell to match the intended device.

In various embodiments, the bus bar reflectivity could be customized to desirably reduce the optical losses that affect voltage and ampere requirements. Such bus bar customization could be necessary to improve the absorption and reduce reflection to improve conduction, open circuit voltage, and efficiency. Photons striking the top surface of the solar cells may be reflected due to high reflectivity of the bus bars in the UV and visible region, resulting in reduced absorption of a very small portion of the incident light. This reflection and poor absorption leads to poor efficiency. Poor absorption of the photons can reduce the amount of available energy necessary to separate electron hole pairs or carriers. Carriers need to be separated before they can recombine. This inability to separate the carriers due to the reflected energy can affect the open circuit voltage of the cell. If there is sufficient energy absorbed, the electric field sweeps the carriers very fast without allowing them to recombine, thus, enhancing current conduction. As recombination increases, the Voc reduces. As a result, one embodiment may reduce the reflectivity of the bus bar by diffusing the reflection through providing some anti-reflective coating over the bus-bars, anti-reflective tape, oxidizing, laminating, coloring, texturizing the bus bar will assist with the reducing the power loss through the reflection of the bus bar material. In addition, other embodiments may change the material used to reduce the reflection and in turn, reduce the losses, shadowing and any resistance within the solar cell.

In another embodiment, the bus bar or grid fingers temperature may be customized to reduce the thermal loss occurring in solar cells, which can affect the amperage and voltage of a solar cell. It may be desirable to use the voltage and ampere matching inputs to achieve a desired output without increasing the temperature of the grid fingers or bus bars. The electrical energy that is transported through grid fingers and bus bars can cause them to increase in temperature, which can reduce the band gap of a semiconductor and affect several of the semiconductor material's parameters. The decrease in the band gap of a semiconductor with increasing temperature can be viewed as increasing the energy of the electrons in the material. Lower energy is therefore needed to break the bond. In the bond model of a semiconductor band gap, reduction in the bond energy can also reduce the band gap. Therefore increasing the temperature reduces the band gap. However, the parameter most affected by an increase in temperature is the open-circuit voltage. As the temperature increases, the open-circuit voltage (Voc) and working circuit cell voltage ($V_{mpp}$) of the solar cell decreases. It may be advantageous to measure the temperature and its effect on the open circuit voltage and/or working cell voltage of an optimized PV system to plot the data for further optimization of the PV system.

In alternative embodiments shown in FIG. 14, the bus bars or grid fingers may have some shape configurations on the faces of the bars and/or grid fingers in such manner that they constitute reflecting surfaces for mutually reflecting radiation away or dissipating heat. FIGS. 14A-14B depict a front view of an embodiment of a traditional square-round solar cell 400 that may have a finned, heat sink bus bar 450. FIG. 14B depict an enlarged cross-sectional view 440 of an embodiment of a traditional solar cell that may have a finned, heat sink bus bar. The bus bars or grid fingers may desirably include facets or heat sinks for directing heat radiation upwardly through the spaces between the bars and thus deflecting heat away from the assembly. Such heat sinks or facets can vary in terms of length, width, height, weight, and heat sink fin style. Round pins or elliptical fins offer a high surface area to weight ratio and provide multiple airflow paths. Straight fins use extruded and sometimes complex shapes to maximize the heat dissipation surface area. Stamped or lasered metal heat sinks can be manufactured in standard configurations, and according to application-specific geometry and thickness requirements. Machined plate heat sinks can conform to exact tolerances and are free of burrs and other irregularities.

In various embodiments, the heat absorption and/or reflectivity of the subcells and/or the array may by modified or customized in a variety of ways, which can include an objective to reduce the temperatures by modifying the surface of the array and/or bus bars or grid fingers by providing various heat dissipation coatings or paints, applying anti-reflective tapes to control temperature, changing component material, or altering coloring to increase reflectivity, increase emissivity and/or decrease temperature (not shown). The surface modifications on the various components of the array will desirably reduce temperature effects on the solar subcells and/or connective wiring, and potentially increasing the available power generated by the array.

In various other embodiments, the consumer may decide to bury the bus bar and/or grid fingers into the front-side contact of the solar cell. Burying the bus bar and/or grid fingers is a process known as "grooving." Grooving may be performed by a variety of methods, but in one exemplary embodiment, the bus bars or grid fingers may have grooves lasered (i.e.

diode pumped solid state lasers, or high capacity lasers) into the front-side contact of the solar cell, then have the bus bars and/or grid fingers inset into the grooves. The shadowing effects of such bus bars are reduced and the efficiency of the solar cell is enhanced. Lasered groove depths can be achieved between 5 and 130 μm.

Of course, as with other customization requests, the use of custom designs can significantly increase the cost of a given solar cell, and thus standard, commercially-available bus bar designs may be preferred in various embodiments.

Solar Cell Assembly

Once the solar cells have been selected, designed and cut into a desired final configuration, the designer will desirably optimize the positioning and placement of the subcells in the photovoltaic (PV) modules. Optimization of the assembly of solar cells may comprise designing the packing density of subcells, designing a stringing process and designing the packaging (i.e framing) of the PV module or array to protect from a variety of weather conditions and consumer harm.

Solar Cell Assembly—Optimizing Packing Density

In one preferred embodiment, the designer may use the voltage and/or amperage matching input operating ranges, and resulting subcell design, to design a desired packing density that desirably optimizes and power conditions the overall output and performance of the PV module or array. FIGS. 16A-16C depict exemplary packing densities of various conventional solar cells with different configurations, such as the traditional square-round solar cell configuration 510, the conventional round single crystalline solar cells 530, and the conventional multi-crystalline square solar cell 540. The packing density of solar cells in a PV module typically refers to the area of the module that is covered with solar cells compared to that which is blank or not covered by cells, such as blank spaces 550, 560, and 570 shown in FIG. 17A-17C. FIG. 17B shows the lowest packing density, or highest blank space 560 for the traditional round shaped solar cell 530. FIG. 17C shows the highest packing density, or the lowest blank space 570 for a traditional square shaped solar cell 540. The packing density typically depends on the shape of the solar cells used. For example, if solar cells are not cut squarely, the packing density of a PV module will be lower than that of a tightly packed PV module.

FIGS. 18A and 18B illustrate one exemplary embodiment of solar energy refracting from low 580 and high packing densities 610. Sparsely packed cells, i.e. like a traditional round solar cell 530, or solar cells assembled in a PV module or array with an open space may have a higher chance that a small percentage of photons 590 that enter the solar cells may strike the spaces in between the cells and scatter 600 more precipitously as shown in FIG. 18A. If the cells were tightly packed, i.e. like a traditional square solar cell 540, the chance of the photons 590 striking the solar cell increases for maximum absorption, and channels the photons to active regions of the PV module 600 as shown in FIG. 18B.

The power loss or "inefficiency" (i.e. pseudo corner optimization) experienced in sparsely packed cells may calculated by superimposing the surface area of the square-round or rounded shapes onto the surface area of the square solar cells as shown in FIGS. 19A and 19B. Subtracting the surface area of the square solar cells 540 from the square-round 630 (see FIG. 19B) surface area or subtracting the surface area of the square solar cells 540 from the rounded surface area 620 (see FIG. 19A) can identify the total surface area lost. A percentage or ratio percentage may be calculated when converting from non-uniform solar cells (i.e. a square-round solar cell to a rectangular solar cell). These ratios may be determined by dividing the surface area of the square-round solar cell surface area or the round solar cell surface area from the square solar cell surface area. These ratios by produce an estimated range of 22% to 27%. However, only a percentage of the total surface area lost can be used as an estimated total gain in power output. The ratios must be reduced by each solar cell manufacturer's stated efficiency. For example, power maximization by tight packing density may be achieved by using Microsol's selected solar cell that produces a 17.46% solar efficiency, and the total estimated power gain should equal the solar efficiency multiplied by the each of the ratios to produce an estimated range of 3.84% to 4.71%. Of course, these values may change when using other solar cell manufacturers estimated solar cell efficiencies, and/or other shapes. In various embodiments, this estimated power gain can relate to the four corners of area 640 gained when choosing a configuration that allows a customer to tightly pack a PV module or array (see FIG. 20). As a result, tightly packing the solar cells with a similar shape and packing configuration allows the customer to introduce a potential or estimated total gain in power output range as compared to less densely packed arrays, and this value can often be added back into a designer's voltage matching or ampere matching input ranges, if desired. This addition or gain of power output may be referred to pseudo corner optimization.

Solar Cell Assembly—Optimizing the Stringing Process

Once the subcell design and number has been selected, a designer will select or design the connections or stringing of the solar cells (i.e., in series, parallel or combinations thereof). Stringing solar cells in series or in parallel may produce a specific output that can meet a consumer's requirements to power or recharge a device. When solar cells are strung together in series, it refers to connecting the positive terminal of one panel to the negative terminal of another. The resulting outer positive and negative terminals will produce voltage that is the sum of the two panels, but the amperage stays the same as a single panel. In contrast, when the solar cells are strung together in parallel, it refers to connecting the wiring from positive terminals to positive terminals and negative to negative terminals, which can create an array having an additive current, but the same voltage as a single subcell.

Figure 21A:
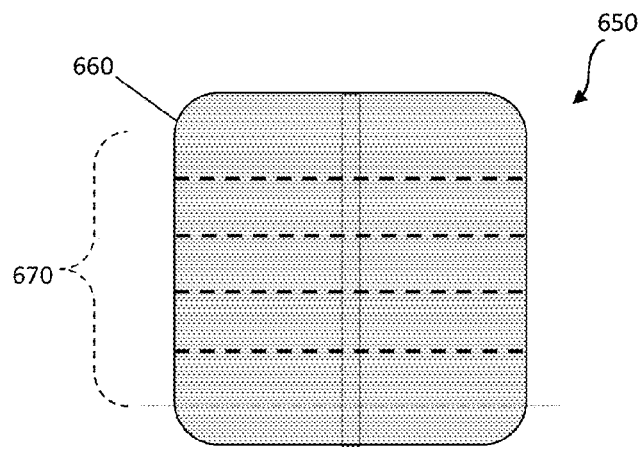
FIG. 21A depicts a front view of a solar cell being optimized by size and shape while undergoing a secondary cutting operation process to match the voltage characteristics of an intended device.
Figure 21B:
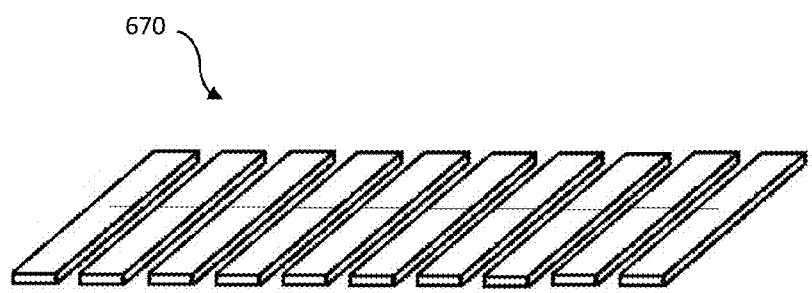
FIGS. 21B and 21C illustrate various embodiments of an optimized solar cell post-secondary cutting process.
Figure 21C:
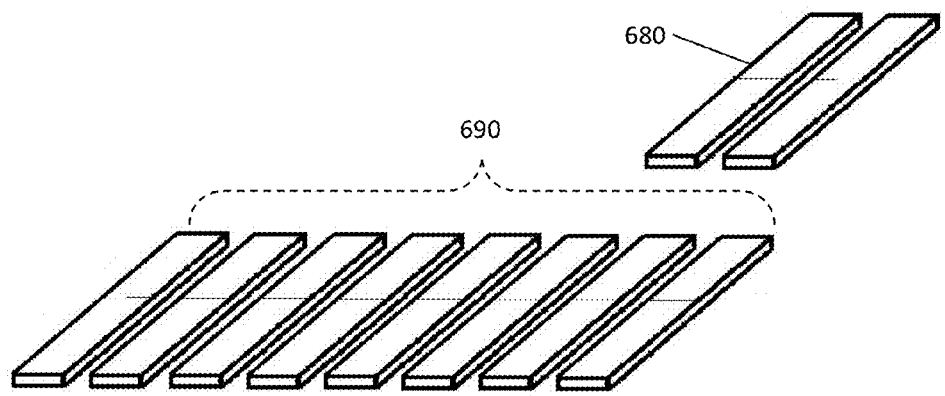

As previously noted, a designer may use the matched voltage and amperage operating ranges of an intended device that requires recharging to cut the solar cells in a sub-cutting and/or a secondary cutting operation. The consumer may desirably select a standard, commercially available square-round solar cell size and can cut the cells, or request a solar cell manufacturer to cut the solar cells in a rectangular or other configurations 670 in a sub-cutting operation (see FIG. 21A) to target the voltage and/or amperage requirements of the cell phone or other electronic load. The consumer can receive the cut pieces 670 of the solar cell as shown in FIG. 21B and select the appropriate number of solar cells 690 (see FIG. 21C) for preparation to string together in series to create a PV module to reach the optimal voltage and amperage characteristics of the intended device or rechargeable battery.

In determining the desired number of cells to match a desired load range, a designer may choose to add various mathematical additions and/or factors to increase or decrease the various values of the solar cell or subcells. In many cases, solar cell manufacturers anticipate the fact that their cells are likely to degrade over time under the influence of the sun or other environmental factors, and thus the power and energy production valuations the manufacturer places on the cell may be overstated and/or understated by a certain amount. For example, a solar cell may be initially manufactured having a useable voltage of 5.7 volts, but after 5 years of use the cell only creates 5.4 volts. In order to meet consumer's expectations and avoid potential litigation, many manufacturers intentionally understate the performance capabilities of their solar cells, to ensure that a consumer's long term expectations of the performance of the cell are met or exceeded. In connection with the various methods described herein, however, such misstatement of the performance characteristics, however innocent, might require recalculation and/or reassessment of the array design, including use of the various methods described herein.

In one exemplary embodiment, a designer may choose to mathematically increase the maximum subcell voltage and/or amperage of the generated power for a given PV module or array design, which could include adding up to an additional 5% or other total gain in power output. Such factors could be added for a variety of reasons, including misstatements of performance characteristics, psuedo corner optimization (i.e., up to a 5% increase) (see FIG. 20), optimized packing density, and/or adding various safety factors and/or irradiance factors (which may range from 0-5%) from over production of isolation based on Standard Testing Conditions (STC) of 1,000 watts/$m^2$ and 25 Celsius with and air mass (AM) of 1.5 spectrum see ASTM G173-03 guidance document) to the calculation. Adding various individual gains in power output to the subcells of an individual PV module or array design can increase the maximum voltage generated in the cell design by the percentage calculated. For example, if the maximum voltage output from the subcells of a given PV module or array design resulted in 4.16 volts, the optimization factor could increase that voltage output to 4.30 volts. In various embodiments, the design of the array will desirably ensure that the optimized and corrected useable voltage falls within the desired voltage range of the charged device.

Figure 22A:
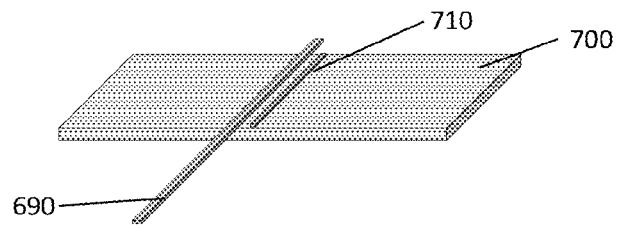
FIG. 22A depicts one embodiment of an optimized solar cell preparing for the tabbing process.
Figure 22B:
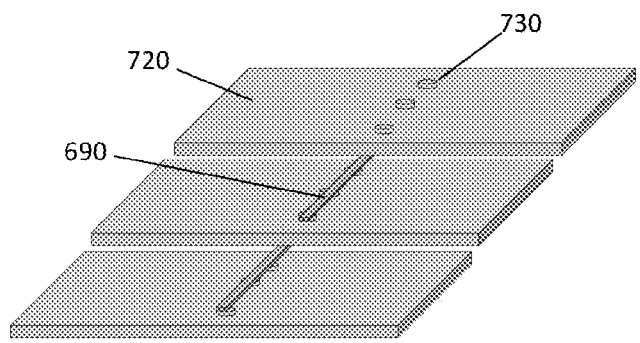
FIG. 22B depicts one embodiment of optimized solar cells of FIG. 22A undergoing the stringing process.

In various embodiments, a designer may prepare to string an array of solar subcells using a tight packing density (i.e., a small gap or high dense packing optimization) prior to tabbing the solar subcells and/or assembling the array. FIG. 22A shows a top isometric view of one embodiment of an optimized solar subcell 700 with a one-bus bar design 710 that is ready to have the tabs soldered 690. The tabbing interconnect ribbon material used to string together the solar subcells can comprise a solder-coated oxygen-free high conductivity (OFHC) copper ribbon which is "dead soft." Dead soft copper is often preferred for such applications, as it is easy to work with and is typically annealed so that it is soft and pliable. The tabbing ribbon is placed on along the length of each solar subcell (see FIG. 22A) bus bar, and soldered using automated reflow soldering or manual soldering techniques. After each solar subcell has been tabbed, several optimized solar subcells 720 may be joined together using an "interleaving" technique such as shown in FIG. 22B, in which the negative poles (front contacts tabs 690) of each solar subcell are connected to the next adjacent positive poles 730 (back contact) of the subsequent cell, thus connecting the solar subcells in series. Desirably, the solar subcells are spaced a set distance apart, which in the exemplary embodiment may be 1 mm, 1.5 mm, 2 mm or greater. Desirably, the subcell or tile spacing should be a spacing that provides optimal packing density. The subcell or tile spacing may optionally be less than or equal to 25% of the subcell or tile height. While greater spacing increases the overall length of the array, it can also significantly reduce the opportunity for adjacent cells to contact each other in an undesirable manner. When the entire array is assembled in this fashion, and the solar subcells are packed tightly together, the string or bussing interconnections to complete the circuit are of a minimal length, which can reduce conductive resistance in the PV system. In various alternative embodiments, the stringing material used could be shaped in a different size or shape, or the string connections may be straight instead of L-bends, which may alleviate and/or increase power losses seen in the system, depending upon the selected design.

Solar Cell Assembly—Optimizing the Cell Encapsulation Process

Figure 23:
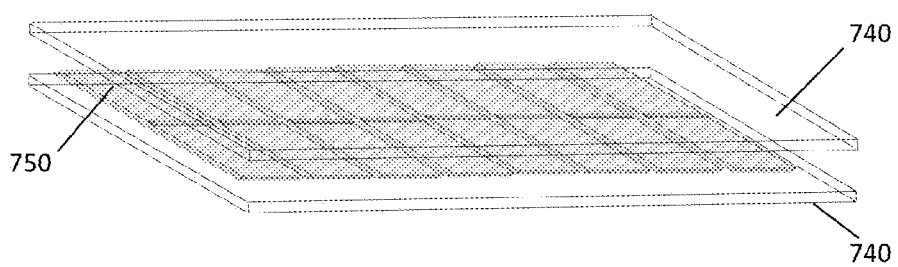
FIG. 23 depict one embodiment of the strung optimized solar cells of FIG. 22B undergoing encapsulation with EVA (ethyl vinyl acetate)

After the stringing process is complete, the subcell assembly will desirably be encapsulated to isolate the cells electrically from their environment, which if properly accomplished can provide significant protection against mechanical stress, weathering, humidity and/or other degradative effects. FIG. 23 depict one embodiment of a strung array of mechanically conditioned and optimized solar subcells 750 of FIG. 22B undergoing encapsulation with EVA (ethyl vinyl acetate) or other suitable thermoplastic polymer, thermoset polymer, such as polyolefin. First, the optimized solar cell PV module 750 can be embedded in a transparent bonding material to provide adhesion and fix the relative alignment and spacing between the solar subcells, as well as secures the entire array in a desired position and orientation relative to the top surface 740 and the rear surface 740 of the PV module. In one exemplary embodiment, the encapsulation substrate might be an antireflective glass that allows more absorption of light into the solar cells, such as EVA (ethyl vinyl acetate). EVA comes in thin sheets about 4.60μ thick with UV stability formulation which can be inserted between the solar cells and the top surface 740 and the rear surface 740 of the array as shown in FIG. 23. The layers can then be heated in a vacuum lamination process to 170° C. to polymerize and cross-link the EVA and desirably bond the module together. The EVA layers will desirably be capable of withstanding high levels of UV exposure without degradation or clouding, should be optically transparent and should have a low thermal resistance. In various alternative embodiments, other antireflective substrates could be used, including a porous coating of silicon dioxide (SolGel), multiple sputtered layers of silicon dioxide and silicon nitride (PV-lite), an etched porous upper layer on the glass (Sunarc), or cast glasses with a pyramid-shaped, grooved or finely textured surface (Albarino ornamental glass) (not shown). If desired, anti-reflective glasses can increase light transmission by up to 3 percent, which could potentially increase the module performance (i.e., for light with a vertical angle of incidence) of up to 2 percent to 3 percent, and in the annual yields (depending upon the location) by 3 percent to 5 percent (since in some instances greater performance increases may be achieved when the sunlight hits the glass at an angle).

Prior to the initial lamination encapsulation process and cross linking the EVA, one exemplary embodiment further includes the placement of a transparent, tempered low-iron glass covering on the top surface or front surface 760, and the rear side backsheet 770 onto the optimized PV module 750. The covering desirably facilitates the easy transmission of solar wavelengths that can be used by the solar cells of the PV module to generate power. For an embodiment constructed using silicon solar cells, the top glass surface could have a high transmissivity of light in the wavelength range of 350 nm to 1200 nm, and might have a standard thickness of approximately 3.2 mm. In addition, the reflectivity of the front surface of the covering should be low. In addition to its reflection and transmission properties, the top surface material should be impervious to water, should have good impact resistance, should be stable under prolonged UV exposure and should have a low thermal resistivity. In one embodiment, the use of low-iron glass reflects less light and does not have the distinct green tint of conventional glass, and the glass is pre-stressed to enable it to withstand high thermal loading expected of a device in direct sunlight for extended periods of time. For example, the white glass used in the exemplary embodiment can allow up to 92% of the light to penetrate with only 8% loss caused by reflections. In other alternative embodiments, the surface material could be textured or roughened to reduce reflection. In addition, if the PV module is a bifacial module, where both the front and the rear collect sun, then another embodiment may place optically transparent low-iron glass on both sides or ETFE polymer on the front sheet or backsheet as a suitable substrate to associate with the glass. Various other surface coverings could include acrylic, Makrolon, other polymers and/or glasses.

The use of multiple layers of encapsulation and/or protection in various embodiments will desirably alleviate concerns with humidity or water ingress, as any water or water vapor ingress into a PV module could potentially corrode the metal contacts and interconnects, and consequently would dramatically reduce the lifetime of the PV module. Moreover, in various embodiments the array can be of a non-flexible construction (i.e., a rigid, inflexible array), which can significantly reduce the potential for work or strain-hardening of various array components, including the various connecting materials, wires and/or bus bars throughout the entire arrays' construction, which can significantly increase the useful life of the array. However, flexible PV power generating systems (i.e. thin film solar cells or sollettes) can be achieved with the same methodology as described utilizing power conditioning algorithms and polymer structure designs.

Figure 24:
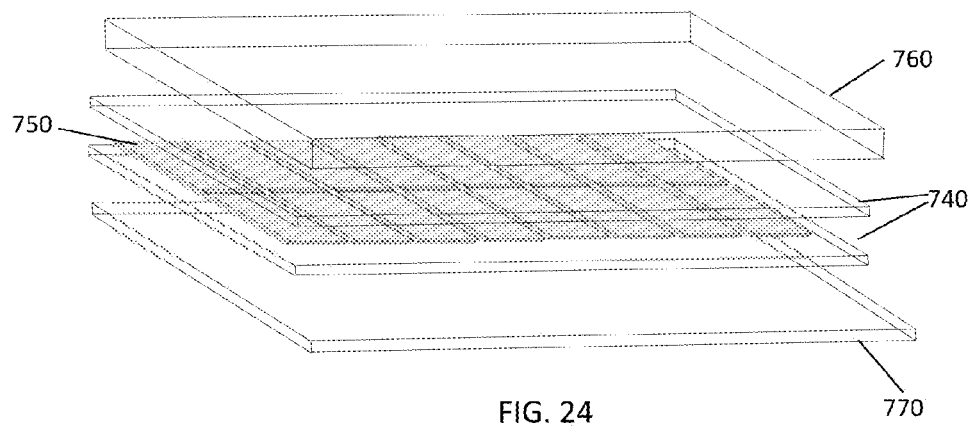
FIG. 24 depict the encapsulated optimized solar cells in FIG. 23 undergoing further encapsulation with top and bottom layer substrates.
Figure 25:
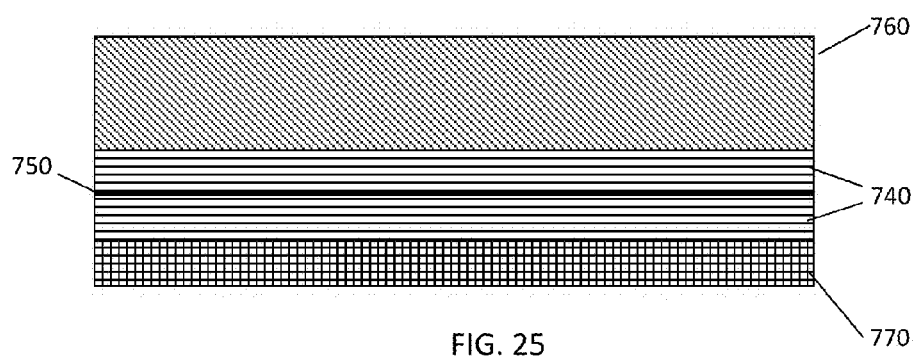
FIG. 25 depicts an a cross-sectional view of the various layers for a fully encapsulated optimized PV solar cell as shown in FIG. 24.

In one exemplary embodiment, the PV module or array could also include a sheet of Tedlar flouropolymer or other thin polymer sheet placed on the rear surface of the PV module or array to complete the encapsulation process as shown in FIG. 24. The key characteristics of the rear surface of the PV module are that it should have a low thermal resistance and desirably prevent the ingress of water or water vapour (i.e., render the assembly waterproof), provide mechanical protection from environmental conditions, provide secure electrical insulation properties, increase UV stability, provide colors, and durability. As best shown in FIG. 25, there may be a significant number of layers encapsulating the final optimized PV solar array.

Solar Panel Assembly—Optimizing the Framing Process

Figure 26A:
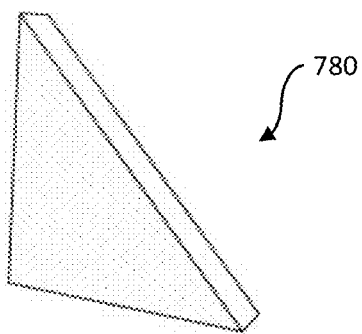
FIGS. 26A-26C depicts an isometric view of various embodiments of parts to frame for a photovoltaic (PV) module.
Figure 26B:
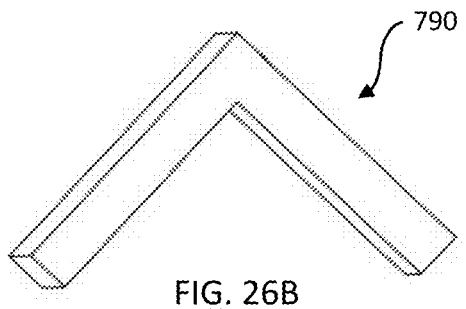
Figure 26C:
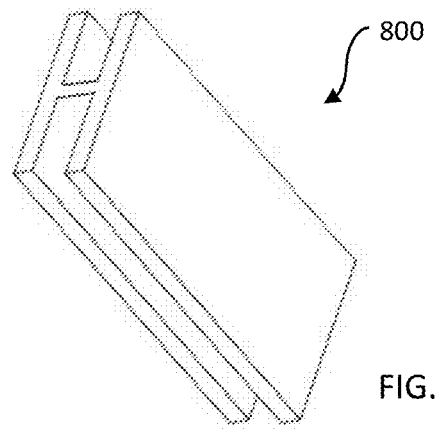
Figure 27A:
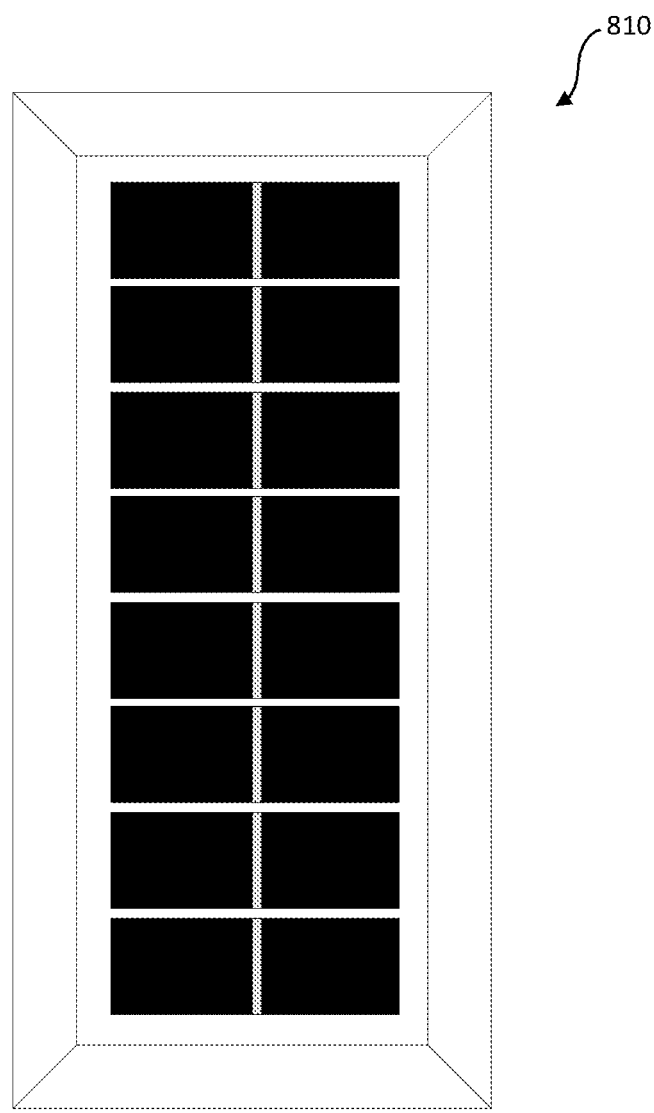
FIG. 27A depicts one exemplary embodiment of an optimized PV module with a 3.3 watt power rating.
Figure 27B:
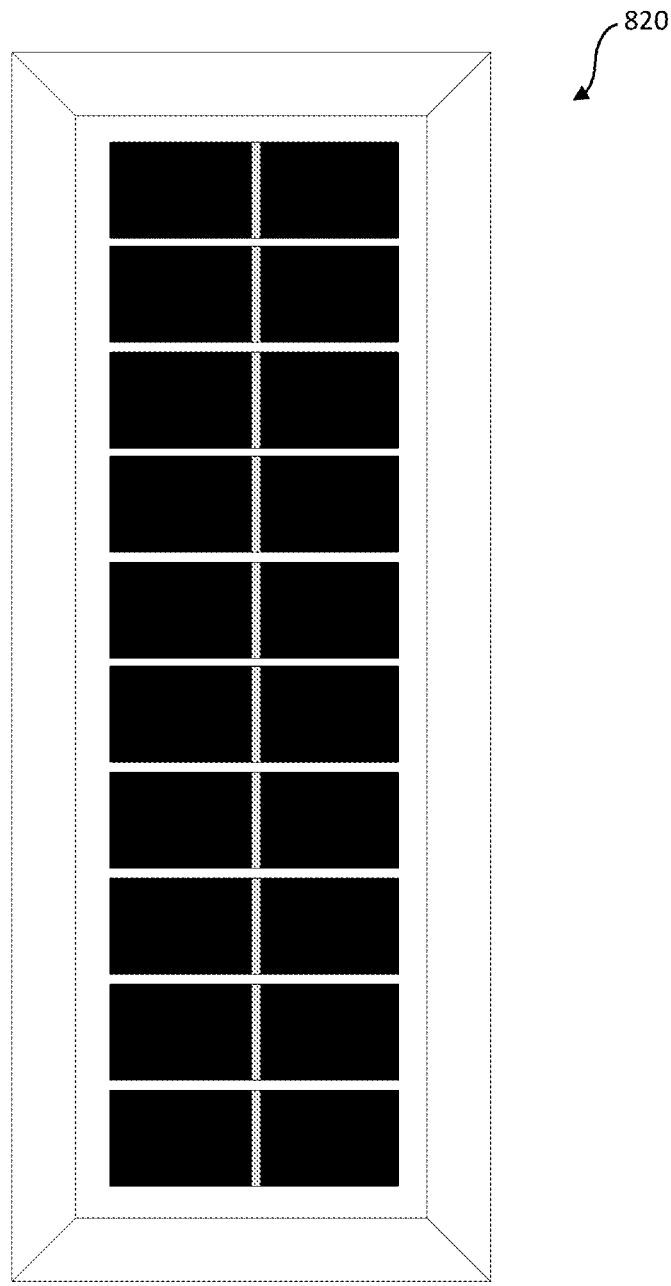
FIG. 27B depicts one alternative embodiment of an optimized PV module with a 4.2 watt power rating.
Figure 27C:
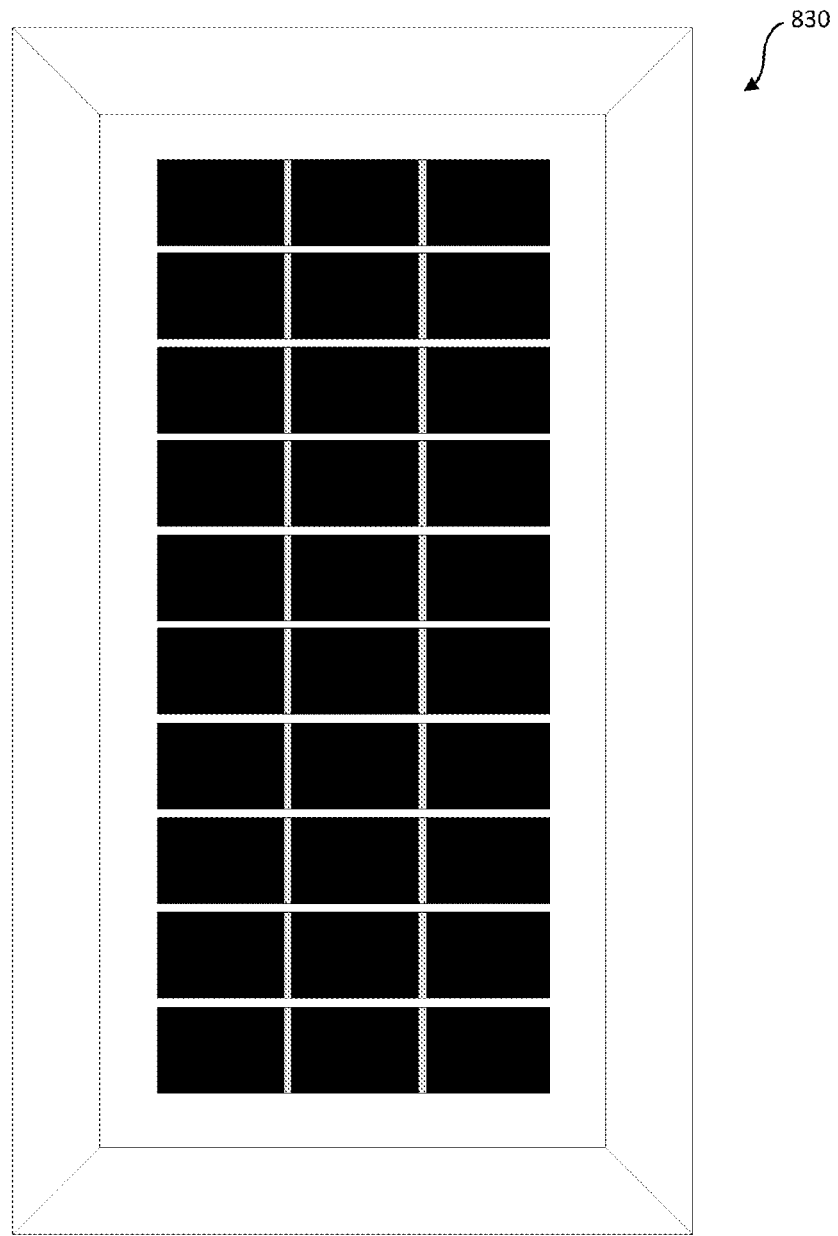
FIG. 27C depicts an alternative embodiment of an optimized PV module with a 14 watt power rating.
Figure 27D:
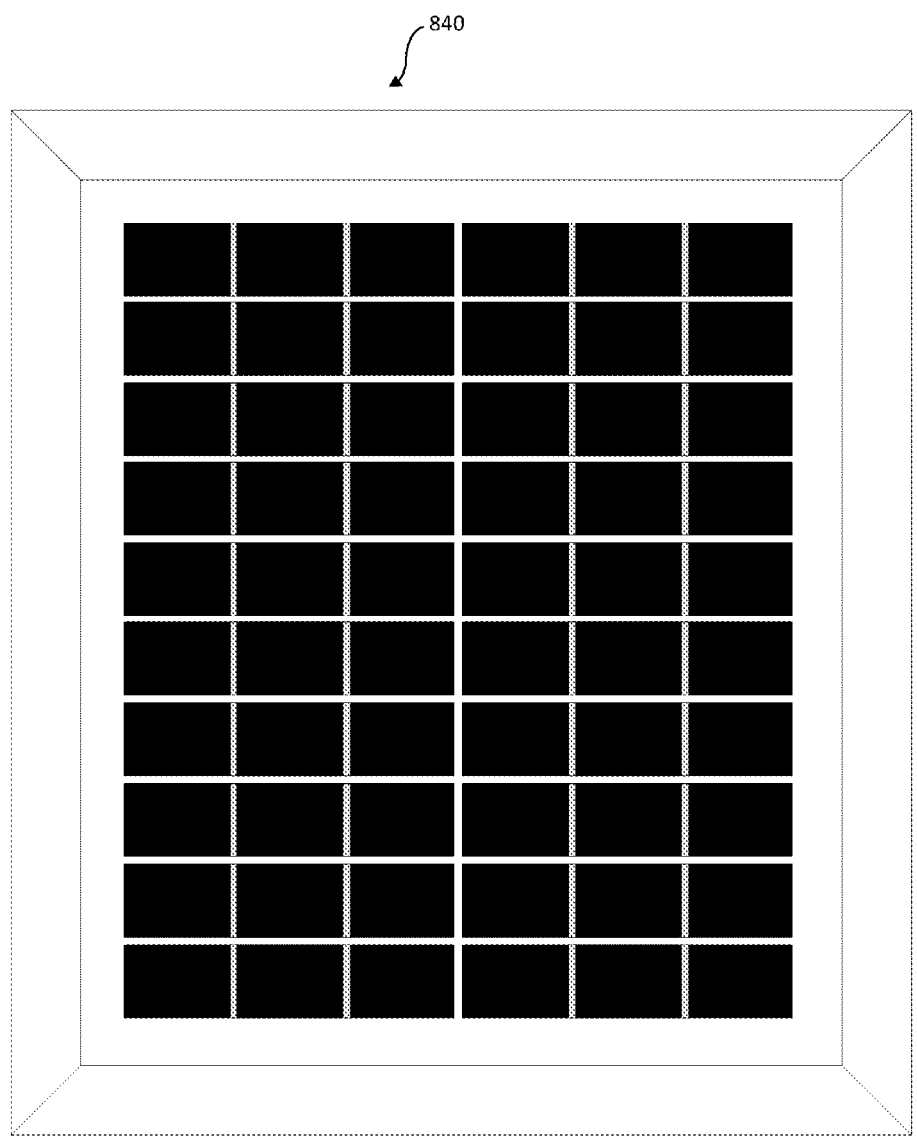
FIG. 27D depicts an alternative embodiment of an optimized PV module with a 25 watt power rating.

Once the optimized PV module or array is fully encapsulated, in one embodiment, the designer can include additional structural components to the PV module or array such as edging or framing. The edging or framing process will desirably further optimize the strength and durability of the array, and will also desirably impart significant impact and/or "bumper" resistance to protect the relatively delicate solar subcells and/or other components of the array from impact or compression damage to the solar laminate. Desirably, the frame will include structural features that fully surround the array, and the frame may also desirably extend in front of or behind the array to a certain degree. In one embodiment, the PV module or array may use a conventional aluminum frame. FIGS. 26A-26C depicts an isometric view of various parts to build an exemplary aluminum frame for a photovoltaic (PV) module. These components may assist with assembling a low profile, rigid, impact resistant aluminum frame. The frame structure will desirably be free of projections or voids that could retain water, dust or other matter. FIG. 26A depicts with a vinyl corner bumper 780 that could be mounted to the outside of such a frame. This bumper may be made from a variety of materials that are known in the industry, including those that have low thermal resistance, good impact strength, and provide significant product longevity. Alternative materials could include various polymers, metals or hybrid materials for the frame. FIG. 26B shows an internal nylon sash corner 790 that could be assembled with the frame and desirably inserted into the vinyl corner bumper that is mounted to outside of frame. The nylon sash could be used to absorb impacts or other mechanical vibrations (i.e. similar to shock absorbers) to prevent damage to the PV solar panel. FIG. 26C depicts one embodiment of an aluminum frame member that could be placed around the four sides of the PV module or array. The aluminum frame could include a power coat, anodized, colored white, or textured surface to provide better thermal resistance and handling ability for the user or when in use.

Figure 48:
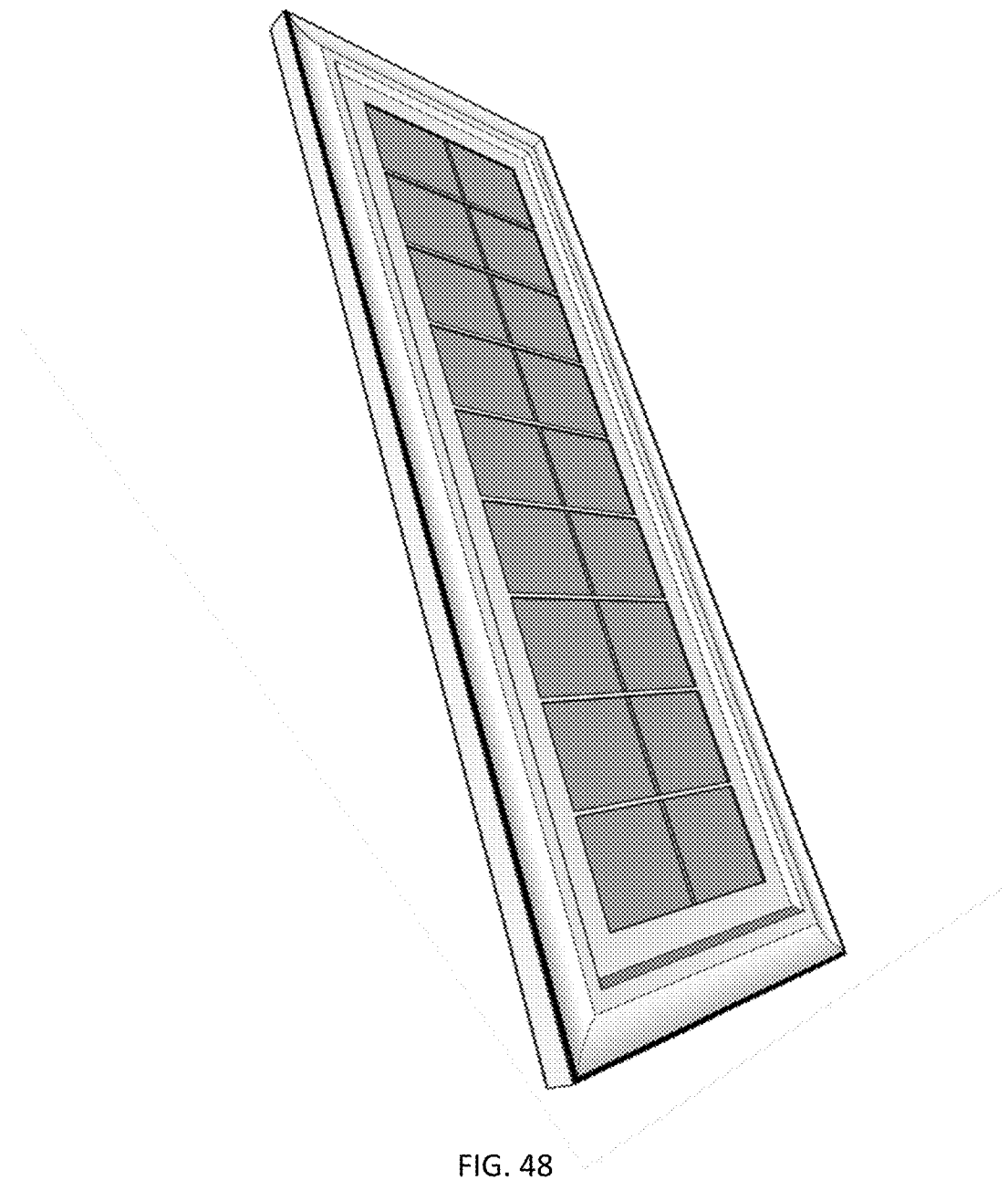
FIG. 48 depicts one embodiment of a 3.8 watt power rated PV system using the frame design of FIG. 28A.

In one alternative embodiment, the PV module or array could be framed in a polymer based frame instead of an aluminum frame as shown in FIG. 48. A polymer based frame may possess excellent UV stability and mechanical properties. The frame may be manufactured to save costs using various molding techniques known in the industry. Polymer frames can also be excellent electrical insulators, are resistance to weather and liquid infiltration, and can adhere well to glues, sealants and/or other adhesives for excellent protection from moisture or humidity. Such polymers that could be used for PV module framing include, but are not limited to, polyurethane, luran, ultramid polyamide (PA), and polybutyleneterephthalate (PBT). The polymer frame may also be texturized or colored to help reflect heat (i.e., a white color or any color preferred by customers) and/or provide features (i.e. finger grooves) that may help consumers in handling the frame.

In other embodiments, polymer frames could include additives such as specialized anti-reflective pigments or colorization that optimizes spectral behavior and either increases energy absorbed from the sun or increase the reflection of NIR radiation (not shown). The additives may make the polymer opaque or transparent. Such transparent additives may include Lumogen, Heliogen, Paliotol, and Paliogen NIR transparent organic pigments to allow NIR radiation to pass through the pigmented layer and be reflected by the substrate. Other such additives may be introduced to improve the UV stability of the plastic and improve thermal stability. These additives may include Uvinu, Chimassorb, Tinuvin, Irgafos, Irganox, and Irgastab. These specific additives may help absorb electricity-generating light and balance thermal protection for the frame.

Figure 28A:
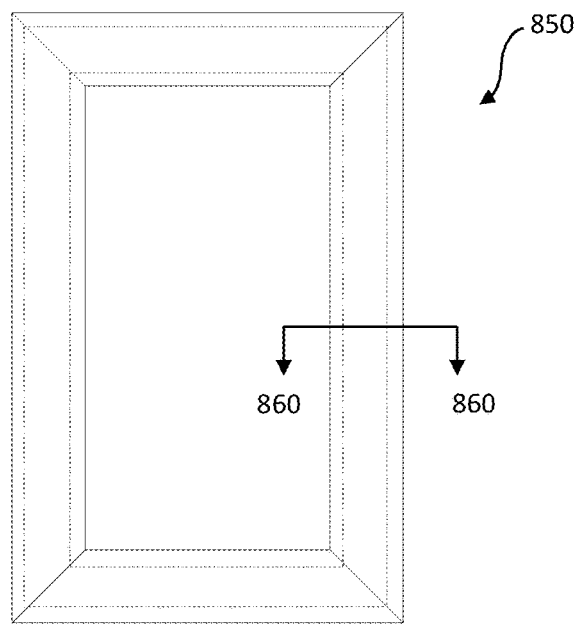
FIG. 28A depicts a front view of an alternative embodiment of a PV module frame that integrates a groove along the edges of the frame.
Figure 28B:
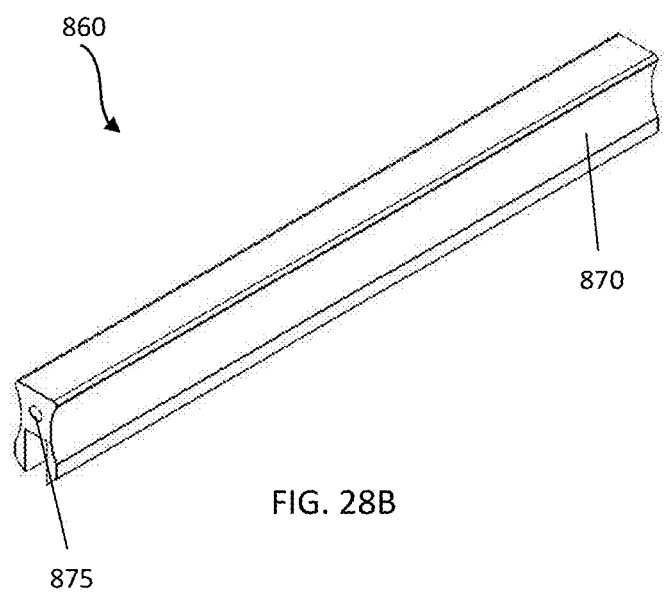
FIG. 28B depicts a magnified view of a portion of the PV module frame in FIG. 28A highlighting the groove.

In alternative embodiments, the frame could have structural designs and/or features within the frame that could assist with holding and/or cooling the frame during use. For example, FIG. 28A illustrates a front view of one embodiment of a frame that may incorporate an ergonomic finger groove 850 extending around the entire frame. FIG. 28B illustrates a magnified isometric view of a portion of a frame 860 of FIG. 28A that may incorporate a "U" groove 870 and a bore 875 that may be used for a screw spline or pilot holes. The "U" groove may be an advantageous ergonomic feature that assists a user in handling the frame easier. The groove may be designed to accommodate any one of the fingers or hands of the user. In addition, the frame may also incorporate some heat sink features to help with thermal resistance (not shown). The heat sink features in the frame (not shown) may be shaped similar to fins and the fin design may be incorporated into the design process.

Once the frame and all of the components are assembled, the various components may be adhered or otherwise sealed together using a variety of sealants, including those that can provide transparent, thermal resistant and waterproof bonds. In one exemplary embodiment, a silicone sealant may be used. Silicone sealants provide for distinctive advantages in framing PV modules or arrays, including long-term elasticity, resistance to weather, resistance to UV radiation, resistance to mechanical or thermal shock and vibration, resistance to aging (i.e. no hardening, cracking, or peeling), transparency and water repellency. In other alternative embodiments, bonding tapes could be used for framing PV modules or arrays. Bond tapes, such as foam bonding tape or other similar tapes, are designed to develop high adhesion strength bonds and reduce or replace mechanical fasteners, rivets, liquid adhesives and welds. Some exemplary bonding tapes may come equipped with a foamed polyurethane core to absorb vibration and distribute stress forces over the entire bond area. Bonding tapes may be advantageous to various embodiments of the invention in that they are easy to apply (i.e. no mixing or cleaning), they have high adhesive bond strengths, the tapes may be cut to fit into complex corners or shapes, and such tapes provide excellent protection from harsh weather environments. Bonding tapes may come in single-sided or double-sided applications. In alternative embodiments, other such sealants may be used, including acrylics, cyanoacrylates and/or polyurethane adhesives, which all provide similar advantages to silicone or bonding tape sealants.

The various design and bonding steps can be performed for a wide variety of frame designs and/or materials necessary to complete the framing process. FIG. 27A-27D depicts various exemplary embodiments of optimized PV modules with a 3.3 watt power rating 810 (see FIG. 27A), an optimized PV module with a 4.2 watt power rating 820 (see FIG. 27B), an optimized PV module with a 14 watt power rating 830 (see FIG. 27C), and an optimized PV module with a 25 watt power rating 840 (see FIG. 27D). Of course, the embodiments depicted herein should not limit a designer from offering multiple optimized PV systems or a range of optimized PV systems that meet various intended devices or a class of devices. The voltage and amperage matching algorithms may be used to design a PV system that may power and/or recharge a variety of portable electronic devices.

Solar Panel Assembly—Junction Box

To further facilitate use of the PV assembly, a junction box or other feature can be provided that encases or otherwise protects an interface between the conductor connections within the PV modules and the desired DC load. In various exemplary embodiments, the junction box serves as a direct connect or direct coupling interface of a solar panel that serves as a vehicle for transferring or delivering power conditioned voltage and amperage matching algorithm formulations in a continuous stream of instruction commands to enable the intended portable device to receive the information and activate the charging sequence.

Figure 29:
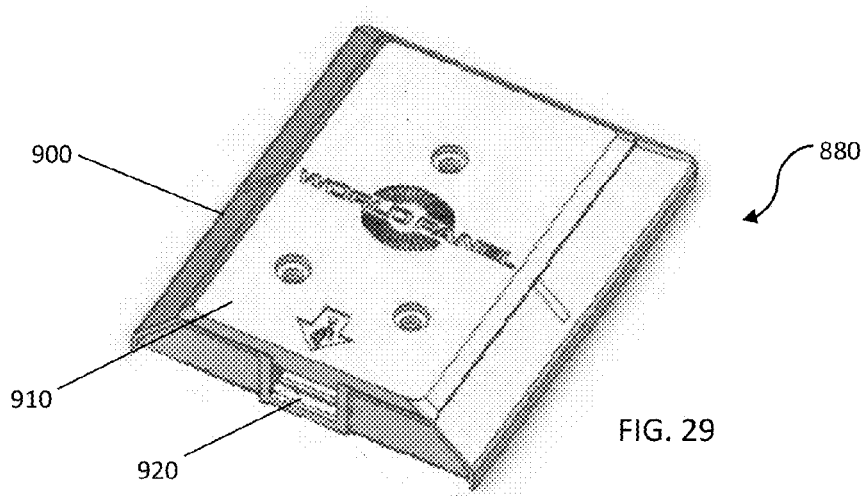
FIG. 29 depicts an isometric view of one embodiment of a fully assembled junction box for a PV module.
Figure 46A:
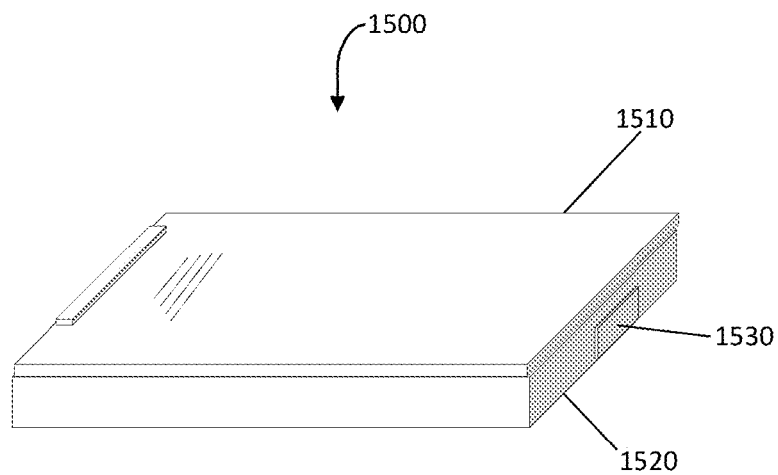
FIGS. 46A-46C depicts an alternate embodiment of a junction box that may be used with the PV system.
Figure 46B:
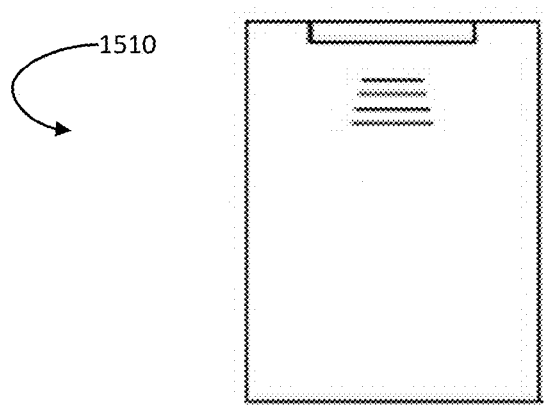
Figure 46C:
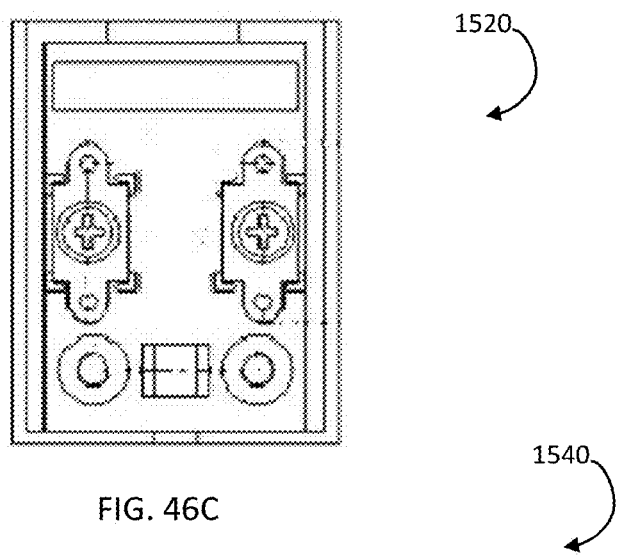
Figure 47:
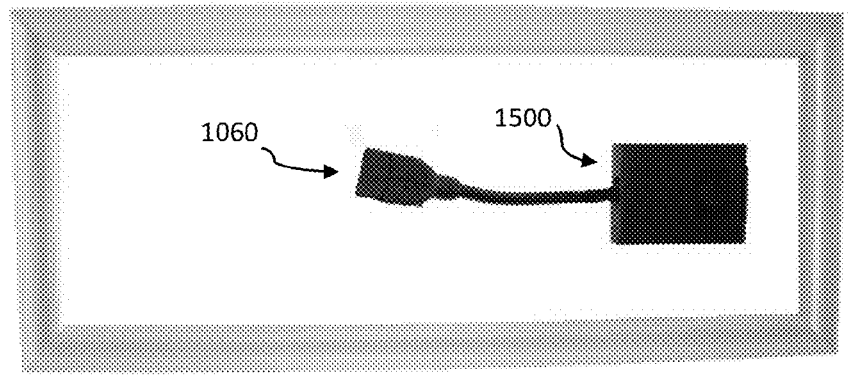
FIG. 47 displays the back view of an embodiment of a PV system with a mounted junction box from FIG. 46A and a flexible length USB.

FIG. 29 depicts an isometric view of one of many configurations of embodiment of a fully assembled junction box 880 for a PV module. The junction box 880 can be an assembly that can include a lid 910, a bottom container 900, and/or an input connector port 920. The junction box assembly can be used to conceal the electrical junctions from the PV module and protect a power output connection from external factors. The junction box may also include features to deter tampering from users. The junction box will desirably provide an interface between output power from the PV module and the input wiring junction, i.e., the USB connector that can connect to the specific device. The junction box assembly may be constructed from various metals or plastics, and may have a variety of shapes such as a square, rectangular design, pentagonal, or octagonal shape. FIGS. 46A-46C shows an alternate embodiment of a junction box 1500 design that may be used with the PV system. The alternative design may include a lid 1510, and a bottom container 1520 with an input connector port 1530. FIG. 47 displays the alternate embodiment junction box 1500 of FIG. 46A with a flexible length USB cable 1060 on the back of a PV panel 1540.

In various alternative embodiments, the manufacturer may design the junction box to be fixed or removable from the PV system. If a junction box is fixed, it may decrease the likelihood of potential damage to the box, or the interconnections within the box. However, if the box is removable, such modularity can give the consumer the flexibility to replace damaged interconnections, input connectors and/or missing parts (i.e. screws), resulting in potentially increased longevity and use of the PV module.

Figure 30:
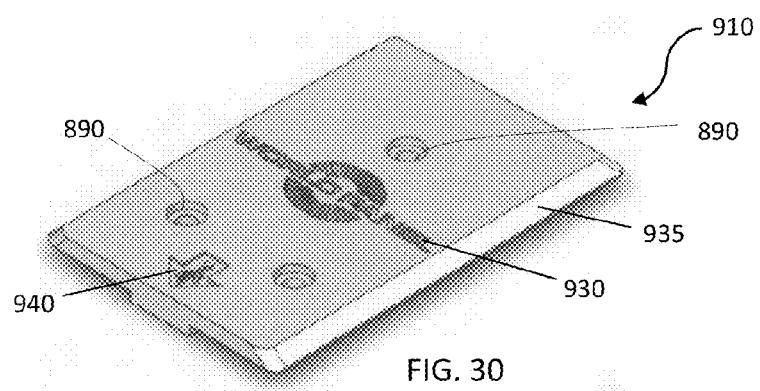
FIG. 30 depicts an isometric view of one embodiment of a top lid for the junction box of FIG. 29.

FIG. 30 is an isometric view of one embodiment of a junction box lid 910. The junction box lid may be designed with various attachment features to allow easy assembly onto the junction box container. The junction box lid may contain screw counterbores 890, an input connector indicator 940, an area for logo placement and positioning 930, and beveled edges 935. The junction box may have screw counterbores 890 designed within the lid to allow various screws to secure the lid to the junction box container. The junction box lid 910 may use a variety of other mechanisms that secure the junction box lid to the junction box bottom container, such as screws, snap fit, press fit, slide fit, adhesive, etc. Also, the junction box lid may provide space for the company logo 930 or any other information necessary for the consumer. Further, the beveled edges 940 on the junction box lid 910 may provide easy handling, and reduce any damage on sharp corners. The input connector indicator 940 can indicate to a user or consumer where to connect the intended device, and may be adapted to have a logo for any potential input connector.

Figure 31A:
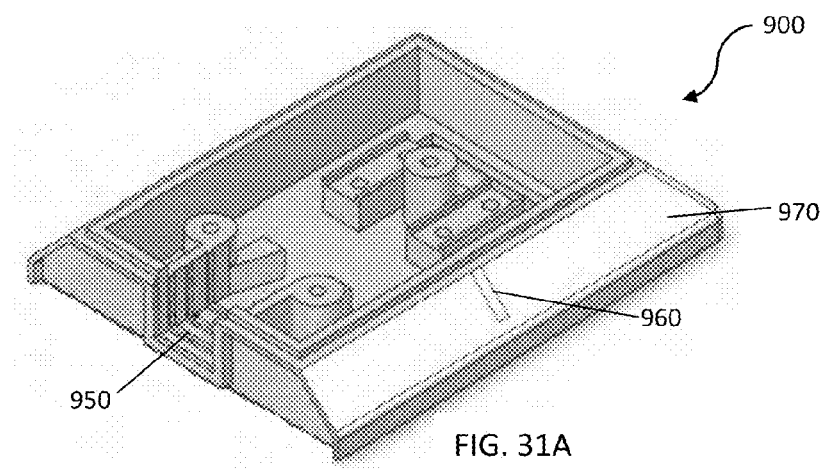
FIGS. 31A and 31B depicts various isometric views of one embodiment of the bottom container for the junction box of FIG. 29.
Figure 31B:
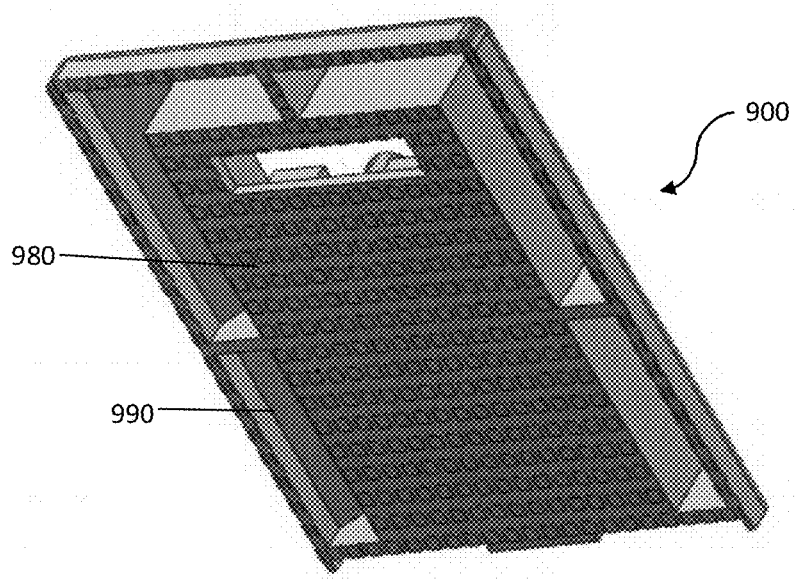

FIGS. 31A and 31B depict isometric views of one embodiment of a junction box bottom container. The internal arrangement of a junction box container 900 may come equipped with standard items, such as an input cable housing 950, beveled edges 960 to prevent user tampering and/or inadvertent removal of the box due to an impact, and tool channels 960. The tool channels may be integrated within the junction box container to allow consumers to insert various tools in the channels and pry the junction box lid 910 open. In addition, the back of the junction box container 900 may be designed with textured surface 980 to assist with aesthetic appeal and/or to improve adhesion to the PV module or array. In addition, the back of the junction box container may also include open voids 990 to allow the flow of adhesive to settle in the voids and provide for better adhesion to the PV module or array.

Figure 32:
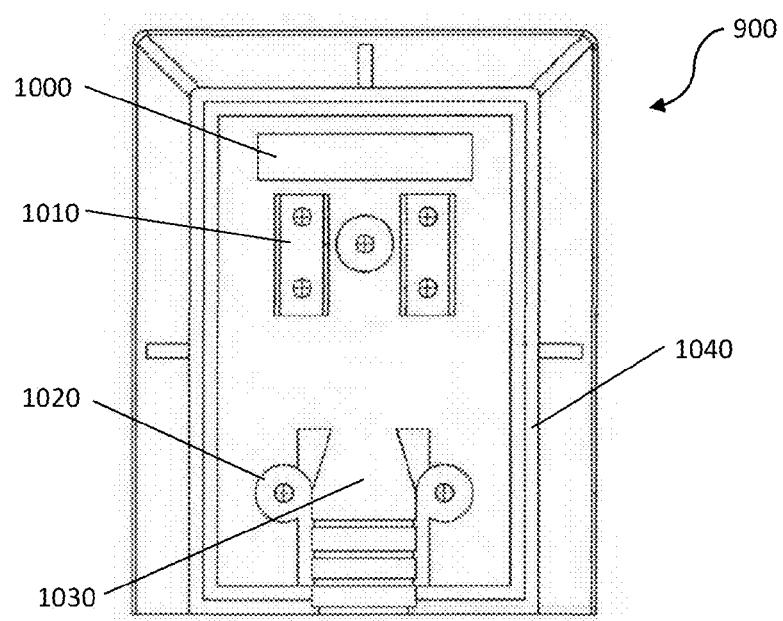
FIG. 32 depicts a top view of the bottom container for the junction box of FIG. 29.

FIG. 32 shows a front view of one embodiment of a junction box bottom container 900. A junction box bottom container may be designed to include knockouts 1000, terminal contacts 1010, threaded tubes 1020, and input cable housing 1030, and guiding channels 1040. The knockouts can allow wires to enter the junction box via the knockouts, or via pre-punched holes in the sides of the box. The knockouts can allow the bus bar connections which protrude from the back of the PV module to extend into the junction box and connect to the terminal contacts. The knockouts in may also include built-in clamps, such that when a user pushes a cable or other wire through a knockout, the cable is held securely in place. Such clamps may be manufactured with any shape and size desired. Once the bus bars are threaded through the knockout and into the box, they can be secured to the terminal contacts 1010. Depending upon the system design, the customer may decide to tighten screws on the clamp to secure the bus bars, or the securing method could include a variety of alternative techniques, including the use cable clamps, screws which secure the bus bars, alligator clamps, or the bus bars may be secured with solder.

The input connector housing 1030 may be designed to accommodate a variety of connectors. In one exemplary embodiment, the input connector housing allows a female USB input connector to be assembled onto the input connector housing. The female USB connector may be designed to fight tightly within the housing and flush with the edges to prevent any movement. The input connector housing may also be designed to accommodate a variety of other USB cables and connectors. Such variety of cables can be connected to mobile phones, portable media players, internet modems, digital cameras, computers, laptops, DVD players or a variety of other gadgets or devices. Other USB cables may include a micro USB cable, a mini USB cable, USB 2.0, USB 3.0, and/or USB-A and USB-B connectors. There are many other non-USB cables that can connect to devices, or gadgets. These include such connectors as 3.5 mm headphone jacks or TSR connectors, mini audio jacks, digital connectors, audio connectors, VGA connectors, S-Video connectors, DVI connectors, HDMI connectors, RCA connectors, data cables, networking related cables, or any type of bayoneted plug.

Figure 33A:
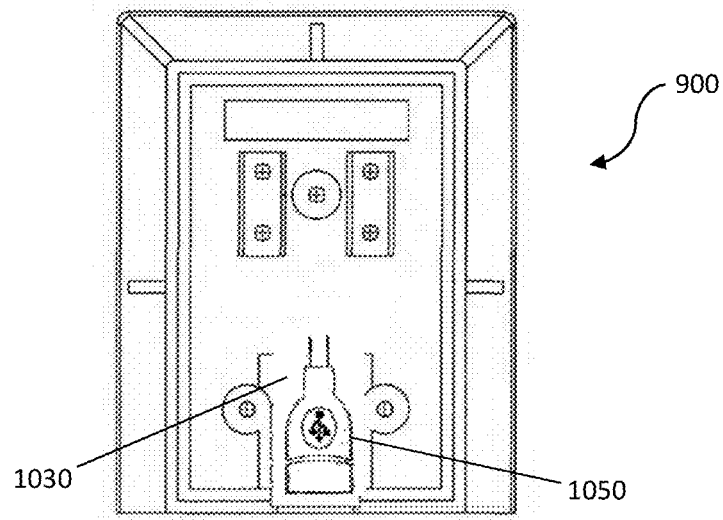
FIGS. 33A and 33B depict a top view of the bottom container for the junction box of FIG. 29 with both integrated and flexible USB connectors.
Figure 33B:
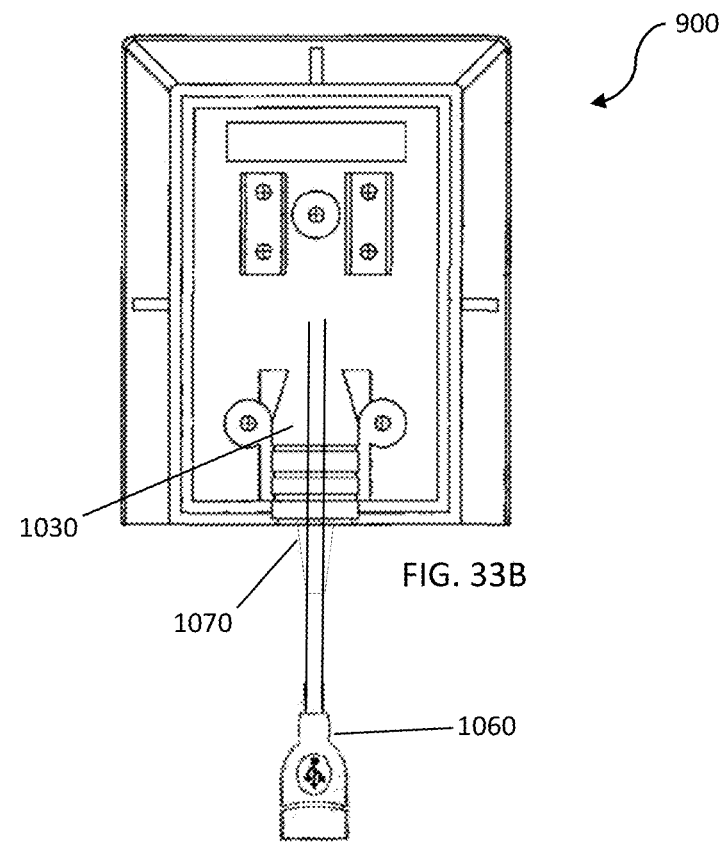

In an alternative embodiments, the female USB connector 1050 may also be fixed or removable from the input connector housing 1030. If the female USB connector is fixed, the USB connector may be assembled integrally within the box as shown in FIG. 33A. The fixed configuration prevents persons from tampering with the connector and provides protection from mechanical stress or over use. However, the input connector housing 1030 may be designed with a removable input connector to allow a consumer the most flexibility in replacing broken/worn out components or changing to new input connectors or new types of connectors. The junction box assembly 880 may open easily using a variety of household tools, and allow changing or modification of the input connector. In an alternative embodiment, the input connector housing 1030 may allow the desired input connector to include a sufficient length of lead cable 1060 to allow for additional flexibility as shown in FIG. 33B. The additional cable length may be further modified to include a relief 1070 to protect the joint of the cable that may be connected to the junction box. The USB connector may be attached by a variety of mechanisms known in the industry, such as solder, screws, clamps, etc. In various embodiments, a length of cable sufficient to reach any portion of the edge of the frame (and thus let the charged device lie flat on the ground with the array standing and/or tilted in any orientation) will be included on the connector.

Figure 35A:
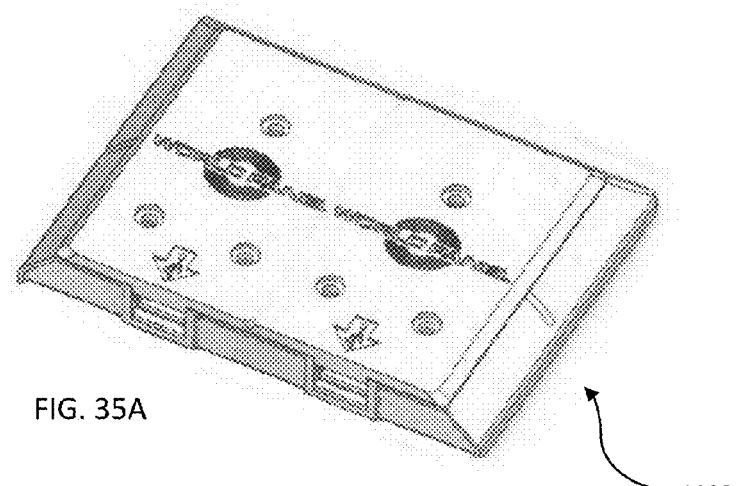
FIGS. 35A and 35B depict various embodiments of two and four hub fully assembled junction boxes.
Figure 35B:
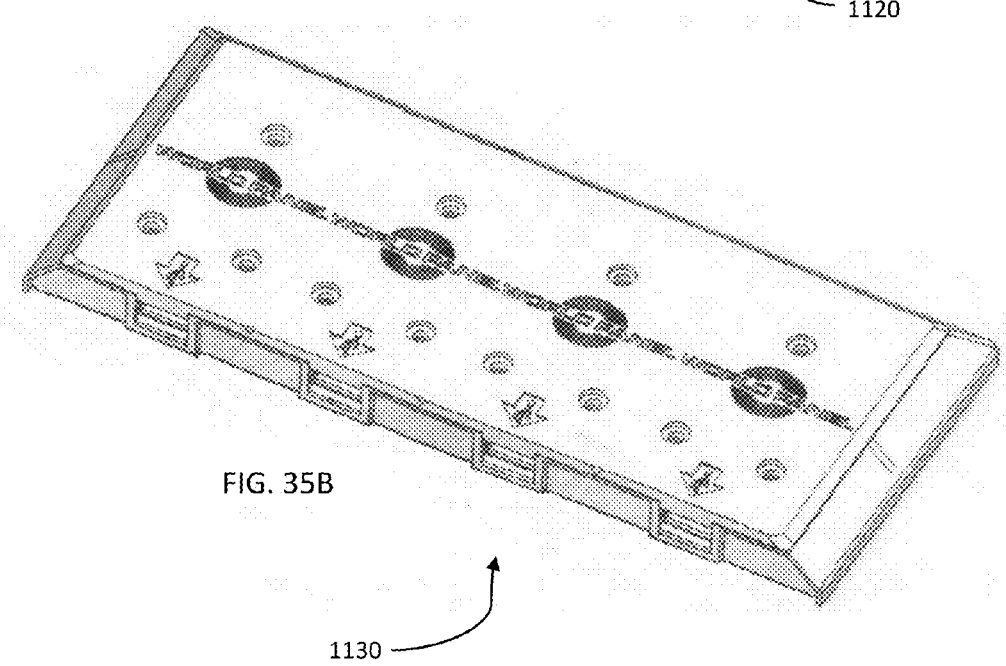

In various other embodiments, the junction box and the input connector housing could be designed to accommodate a combination of various cables for multi-cable or multi-connection systems (not shown). Such a design could allow for maximum versatility for powering or connecting multiple devices to one system without changing connectors or requiring supplemental connectors or splitters. In alternative embodiments, the junction box and the input connector housing could accommodate multiple ports for the combination multi-connection system, i.e., two female USBs or four female USB ports (see FIGS. 35A and 35B respectively).

In various other embodiments, the junction box and input connector housing could include an integrated circuit box or single connector technology design to allow for a one-port connection design. The one-port design may allow for quick connects or disconnects for different connector configurations, and could even include a one USB main multi-core cable connector with associated multi-input subconnectors designed for a variety of phones or other devices that may be attached for powering or recharging devices. For example, in one exemplary embodiment, the main connector could be designed as a USB port that connects into the female USB input connector designed into the junction box. The main USB connector can have multiple sub-connector configurations to recharge specific devices, such as ipod or ipad, Motorola mobile phones, Nokia mobile phones, Samsung mobile phones, and a variety of other phones that might require recharging.

In alternative embodiments, the junction box and input connector housing may be designed to allow for multiple modules to be connected together without opening or otherwise accessing the interior electrical connections of the junction boxes. The port connections may allow the PV panels to be connected in series, where the panel may have two male ends on an input connector to connect to the first PV module, then connect to the second PV module. Similar type connection could alternatively allow connection of the panels in parallel, if desired. These types of arrangements could allow for the flexibility to increase in specific output requirements should multi-connection of PV modules be desired. Alternatively, the customer may use the multi-port junction box designs in FIGS. 35A and 35B to allow at least one port to be connected to another PV module, and/or any other ports to be connected to peripheral devices or adapters.

Figure 34A:
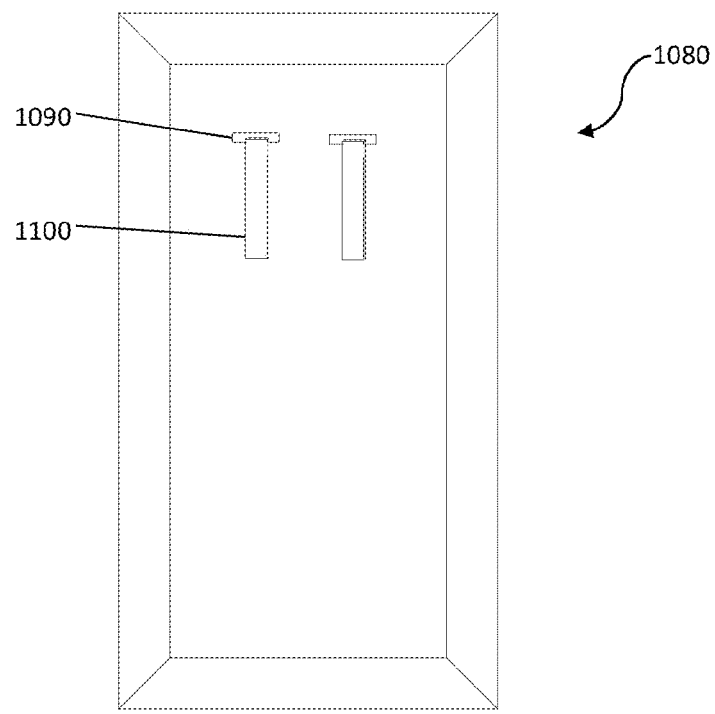
FIGS. 34A and 34B depict a back view of an optimized PV module with the bus bars extended through the backsheet layer substrate and the bottom container of FIG. 32 positioned for assembly.
Figure 34B:
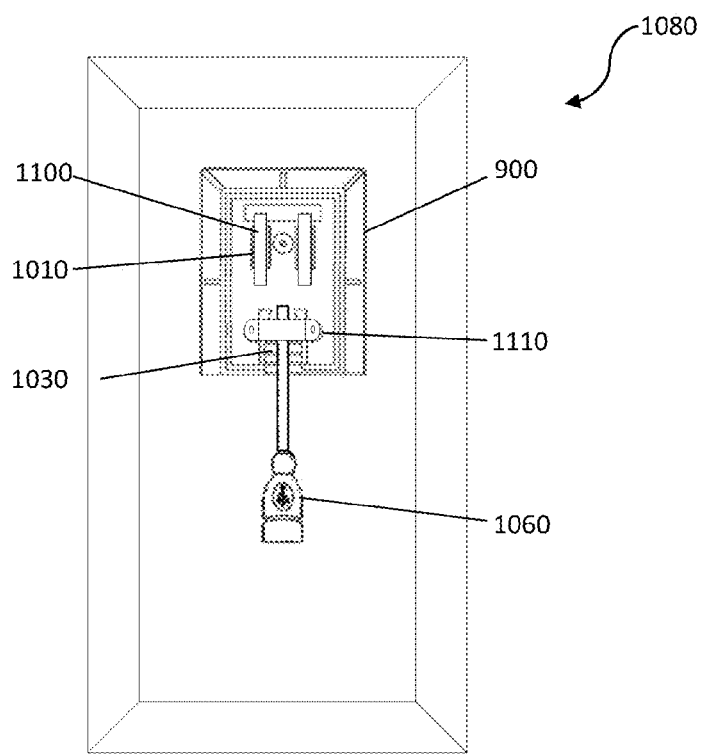

FIG. 34A depicts a back view of an exemplary PV solar panel 1080, showing a pair of bus bars 1100 that have been threaded through the bottom backsheet surface and any rear encapsulant of the framing 1090. In this embodiment, the bus bars for the subcell strings extends through the embedding material to the outside of the multi-layered array, extending through a rear glass panel with holes 1090, or other equivalent arrangement (i.e., the rear sheet film of the array is penetrated, etc). In this arrangement, a junction box may be positioned proximate the bus bars (and optionally assembled externally) on the back of the PV module, such that the junction box encapsulates or covers the exit point of the bus bars as shown in FIG. 34B. Once extended into the junction box, the bus bars 1100 can be secured to the terminal contacts with screws, clamps, solder, or common mechanisms known in the industry. Once the bus bars are attached to the terminal contacts, the relevant input connector 1060, such as a USB cable or female socket, can be attached. If a flexible cable length 1060 is chosen, the flexible cable length 1060 should have a portion thereof stripped to have the positive, negative, D+ and D− wires exposed. The stripped flexible cable can be assembled onto the input connector housing 1030 and may be secured to the box using the appropriately sized cable clamp 1110. The exposed negative and positive cables can be securely attached to the bus bars negative and positive terminals while the D+ and D− wires can be configured to BC 1.2 specifications. Desirably, the connection between the junction box and the PV array will be sealed to prevent ingress of water or vapor proximate the bus bar holes. If desired, the bus bar holes may be filled with sealant.

In another embodiment, the solar panel junction box, with the secured bus bar and relevant input connector wires assembled into the bottom junction box container, can be potted or filled with similar agents to pot the entire container for reliable performance and durability (not shown). Many other advantages exist for such potting, in that potting can provide significant protection to the cables from corrosion, can protect against moisture ingress through the back of the panel, can be an excellent sealant, can adhere to the variety of substrates that may be assembled within the junction box, and can provide thermal stability and/or fire resistance during use.

A wide variety of commercially available potting agents can be used, including such potting materials as silicone or other commonly available potting agents. The resulting design is a solid state, direct use PV power generator devoid of integrated circuit board or power conditioning electronics, resulting in an inexpensive, more reliable, and more durable product, which has an extended, or long-term lifecycle of 25 years.

Peripheral PV Module Hardware

In various embodiments, the fully assembled PV module will be designed for rugged, sturdy, outdoor use, and is desirably designed to provide power to a specific device or device class without requiring peripheral hardware and/or electronic power condition equipment. To improve convenience of a user, various additional embodiments and user-friendly design features can be included, such as additional design features that may accommodate user or consumer convenience for transporting, handling, indication of solar light incidence angles, temperature gauges, and/or storage.

In one embodiment, the PV module may be designed with straps (not shown). The straps may be single or dual adjustable straps that allow the user to strap it on his back, or on his bicycle, or his motorbike. The straps may be non-elastomeric or elastomeric with securement mechanisms attached for flexibility. The straps may be removable or fixed to the PV module or array. The straps may come equipped with modified D-straight gate carabiners or other carabiner styles for easy carrying convenience on a belt loop or any other surface or structure that the carabiner may be attached. In various embodiments, the frame may include one or more openings or loops to which straps or other securement features (i.e., bungee cords or carabiners, etc.) may be attached.

FIGS. 36A and 36B shows front and side views of one embodiment of a PV module 1140 design that may incorporate a manual sun indicator 1160. The PV module may be designed to include a through-hole feature 1150 that allows a rod or some other indicator to extend through the PV solar panel. The through-hole feature 1150 may be placed in the center or on the top of the PV panel to provide the best location where the manual indicator 1160 may extend therethrough. The through-hole feature 1150 may be designed to accommodate any shape for tool, stick or other support structure that can extend therethrough. In addition, the through-hole feature may be aligned with a rubberized gasket or other friction like material (not shown) that will prevent the tool from sliding out.

The sun indicator 1160 may allow adjustability or tiltability of the PV module to permit positioning to optimize absorption of solar energy and charging or powering of any device. In one embodiment, the PV module may incorporate into the design a tiltable PV panel with a support structure or sun indicator 1160 that may extend through the through-hole feature in the center 1150 of the PV module or the top end (not shown) of the PV module 1140. The support structure may have an upper end that will be coupled to the PV module, and may have specified apertures (or teeth) 1165 that provide for measured tilt or height adjustability. The support structure or sun indicator 1160 may be designed at set angles, such as 0 degrees 1170, 30 degrees 1180, 45 degrees 1190 and 60 degrees 1200. Alternatively, the support structure may be designed to tilt to a variety of angles (not shown).

In another embodiment, the designer may use a variety of thermal temperature or solar sensitivity strips that may be fully integrated within the PV system (i.e., embedded within the laminated layers or frame) and/or easily removable (not shown). The designer may manufacture stickable strips that have colour changing materials (i.e. similar to heat sensitive thermochromic ink) to monitor ambient or surface temperature, and/or solar incidence angles to improve the operation of the PV system (i.e., to prevent the open circuit voltage from thermally degrading) and help the consumer to decide when the optimal conditions (i.e. optimal time of the day and temperature) that the PV system can provide maximum, acceptable, and minimum power output based on thermal timing mathematics. Various custom designs or colour changing products may be produced to specifications.

FIG. 37A shows a back view of one embodiment of a PV module design 1210 that may incorporate a shelf 1245. The shelf may be used for a variety of reasons, including storing the device that is currently being powered, store other personal items during powering or charging, or it may be used for a support structure to allow for tiltability. The shelf may be completely removable, and may be manufactured from a variety of durable and UV resistant materials known in the industry. The shelf may include two posts 1230 that may be coupled to the shelf by inserting into counterbores 1240 that match the shape of the posts 1230, and where the second end may be coupled brackets 1220 that is positioned on the back of the PV panel 1210. The shelf may also have hinges (not shown) at one end to allow for low profile folding onto the back of the PV module (see FIG. 37B).

In an alternative embodiment, the front of one embodiment of a PV module may include a shade to restart or reset the PV module open circuit voltage (not shown). The shade may be designed as an integrated piece or be removably connected. The shade may also be designed as roller shade, where the consumer may pull the shade over the cells to reset the voltage and/or the current to activate the recharging of the intended device. Alternatively, the consumer may also use any other natural gestures, such as waving a hand over the device to reset or "wake-up" the PV module output to activate the intended device charging sequence.

Figure 44:
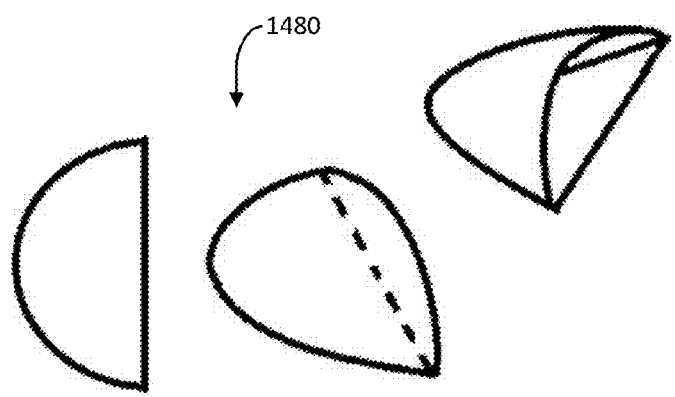
FIG. 44 depicts one embodiment of a dome shaped picture framing hardware that may be mounted on the back of a PV system.

In various embodiments, the module may include standard picture hanging hardware (i.e. dome shaped hardware 1480) that may be secured to the back of the optimized PV system as shown in FIG. 44. Such basic hardware may be purchased in various framing stores, may come in a variety of sizes, and may be easily mounted (and removed) to the back of an optimized PV system to allow consumers to place sticks, branches, or other functional tool to help tilt or hold up the PV system.

Smart Interfaces—Smart Adaptors and/or Smart Optimized PV Systems

Figure 38:
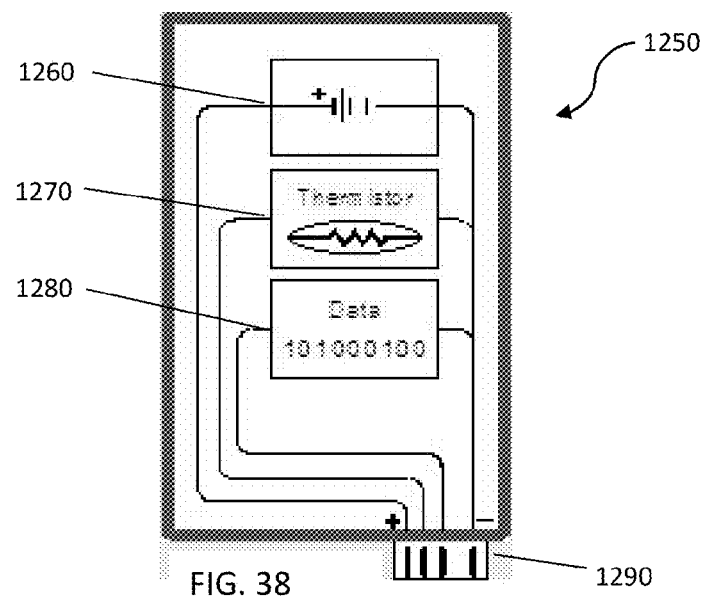
FIG. 38 illustrates an electrical diagram of a "smart" phone rechargeable battery voltage and data lines attached to a USB connector.

An increasing number of cell phone and other rechargeable devices are being manufactured as "smart charging" devices or rapid charging clients. "Smart charging" devices include features that allow a charged device to communicate with the host recharger, the rechargeable battery itself, and/or communicate with the intended device in some manner. The smart battery generally contains one or more secondary battery cells, an analog monitoring chip, a digital controller chip, various other electronics, and a redundant safety monitor chip. These electronics are used to monitor voltage, current, and temperature of the battery cells and manage proper discharge and charging of the battery bank within desired safety limits by communicating between the intended device, battery and peripheral chargers. FIG. 38 depicts a simple electrical diagram of one embodiment of such systems, which can deliver communications and/or data through at least one data wire or line and/or voltage 1260 and ground 1280 in the remaining wires or lines. In one exemplary embodiment of a USB connector, the data wires are referred to as the D+ and D− lines ("D" or data lines), and data lines or wires transmit the signals to the female input connector 1290. The data lines may be used by the intended device and/or rechargeable battery to identify the connected apparatus (i.e. charger) and determine the purpose thereof. This is called "handshaking," and it consists of the monitoring of several voltage signals used in the process. Upon certain criteria transmitted by the intended device and/or rechargeable battery to the host (i.e. the charger), and depending on the host response, the intended device and/or rechargeable battery can deduce that the PV power generator is a direct charge port (DCP) that meets BC 1.2 specifications. Once the type of DCP is identified, the intended device or rechargeable battery can initiate the charging sequence, and allow accelerated levels of energy for rapid charging or monitor the level of power allowed to match the battery charge status. The data lines can interact as an algorithm validation mechanism to improve the mathematical conformity for advanced energy charging communications. The data lines consist of the data that may provide the state of charge information or clock information 1280, and desirably for temperature sensing 1270. The remaining set of lines are reserved for the positive and negative power terminals.

One of the various functions of a "smart" controller are the monitoring and communications to a dedicated charger. The "smart" controller has functions which auto-detects and monitors USB data line voltage, and automatically provides the correct electrical signals on the USB data lines to charge the intended device, class of devices or battery. Should the "smart" controller detect the proper voltage, it can permit or allow the current to flow to initiate charging.

The "smart charging" or "smart" controller device can also be used to assure that only specific types of charging equipment are allowed to be used in conjunction with a specific device type. In many case, a manufacturer may have designed proprietary devices and/or batteries that can only be charged by specific device types, or charging by one device type can be enhanced and/or optimized over others (i.e., "authorized" charging devices can provide a higher current and lower charge time than "unauthorized" devices). In some case, this relationship would ensure the safety and performance of the device, while others simply locked the device owner to the purchase of a related charging product. Such devices have been manufactured by a variety of well-known companies, including Sony, Hitachi, Apple, GP Batteries and others, and these products are typically sold at a premium price.

As result, there exists a need to customize an independent adaptor that can integrate some of the "smart" monitoring and control capabilities to bypass and interface with the intended device or battery to allow recharging, and/or customize an optimized PV system to bypass and interface with the intended device or battery to allow recharging.

Smart Interface—Independent Adaptor

In various embodiments, a "smart phones and/or tablets" interface can be optionally included that interfaces with and accommodates "smart charging" devices to allow a directly coupled solar PV module or array to interact with and power or recharge such devices. "Smart charging" devices can include devices using a variety of connecting systems, one of which is popularly referred to as a Universal Serial Bus (USB) device.

Figure 39:
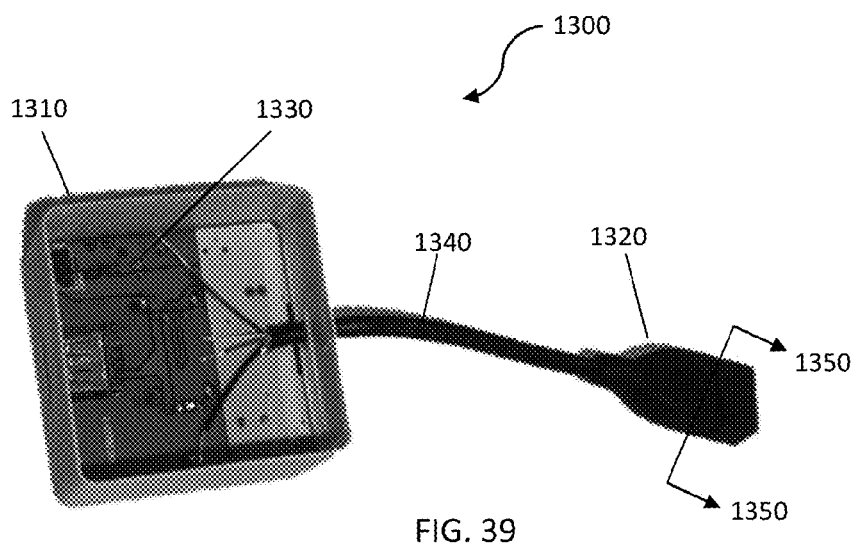
FIG. 39 illustrates a top view of one exemplary embodiment of a "smart" phone interface adapter.

FIG. 39 illustrates one exemplary embodiment where a manufacturer may design an independent "smart" phone/tablet interface (SPI) 1300 or a "smart" phone/tablet adaptor (SPA) to be compatible with devices that contain "smart" systems, and provide the same performance and safety factor required for recharging batteries. The SPI may be design integrated with the PV module or array, or may come as a separate adaptor that may be plugged into a direct coupled junction box that may be positioned in the back of a PV module or array. The SPI come equipped with a junction box 1310, circuit mother board 1330, and an input connector 1320 with a flexible cable length 1340.

The circuit motherboard 1330 may have various integrated circuits that can provide features to replicate functions that the "smart charging" device is expecting to see, such as transmitting a coded sequenced to unlock a certain function or transmit various voltage matched operating characteristics of the PV module to the mobile phone. In various embodiments, the SPI may regulate the output voltage that the "smart charge" device has been programmed to accept. In one embodiment, the circuit board may control the state of charge for a "smart" battery within a cellular phone. The circuit may be programmed to protect the phone and terminate the charge current when the battery may be fully recharged. In one exemplary embodiment, a SPI may include a circuit battery temperature monitor that may be able to control the mobile phone voltage from elevating too high and overcharge the battery. Heat buildup and bulging are early indications of pending failures before potential disintegration occurs, and it some cases the data line may include information that identifies such condition to the SPI. In another embodiment, the circuit may be designed to sense temperature and control the input voltage. In another embodiment, the circuit may provide relevant information for a mobile application (app) interface or provide online communications about related productivity, and/or provide the voltage and/or amperage matching algorithms to design optimized PV systems. The circuit may also allow for the transfer of performance through an app for calculating energy usage and carbon off-sets in order to, for example, participate in carbon credit funds and consolidated data mining. The circuit may be able to send precise information to the charger or charge controller, which automatically adjusts voltage to help ensure full battery charge depending on the ambient temperature of the battery installation.

In an alternative embodiment, the circuit may be customized to allow the transmittal of the mobile phone voltage operating characteristics to the phone. FIG. 40 depicts one embodiment of a male USB input connector 1350 that may be used in the designing an SPI. The circuit may act as the interface between the direct DC voltage output from the PV module or array, and the mobile phone or tablet. The PV module may already have been designed after voltage or ampere matching to the mobile phone, and the DC voltage may be connected directly to the circuit or by plugging a removably connected adapter to the port already available on the PV module or array. The circuit may allow the transmittal of the exact voltage operating characteristics to the phone 1360, where the voltage lines will communicate directly with the mobile phone's "smart" battery. The remaining data lines 1370 and 1380 may or may not be used to communicate to the "smart" battery (i.e. "shorted" lines), but instead their functions might be replaced by the internal circuit board 1330 integrated within the SPI 1300. Lastly, the ground connection 1390 may be connected to the SPI to carry the matched voltage of the intended device or other purpose found useful for advancement of the resource configuration.

FIGS. 41A and 41B shows one exemplary embodiment in which a male USB connector 1320 with a flexible cable 1340 may be stripped to expose the voltage and data line sets 1400. The voltage line 1410 and the ground lines 1440 may be directly connected to the SPI circuit board 1310 with any commonly available method for electrical conduction of the DC output voltage from the PV panel. The circuit board can be programmed or customized to transmit the proper voltage operating range that may have been previously optimized during the PV solar panel or module design using for example, power regulators and timers. In addition, the temperature indicator 1430 and the state of charge 1430 from the "smart" battery may be desirably removed from the flexible cable 1340 (see FIG. 42) and its functions replaced by the SPI circuit board 1310 at the designers option. The SPI circuit board may be designed to operate independently of the "smart" battery allowing for the same protection and guarantees of excellent performance that a "smart" battery manufacturer may provide.

Smart Interface—"Smart" Optimized PV System

In one exemplary embodiment, a designer may optimize a PV system to include the physical optimization embodiments described herein, but also it may be optimized to interface with "smart" controllers to allow a direct-connect solar PV module or array to interact with and power or fast recharge such "smart" devices. As previously described herein, when chargers are plugged into an intended device with such "smart" controllers in the battery, the "smart" controller typically auto-detects and monitors the voltage limits to permit the battery and/or device to draw current for charging and/or powering the intended device. The "smart" controller uses a variety of mechanisms to distinguish between the various types of compliant USB charging ports that may be used with the intended device.

It may be desirous to design the optimized PV panel to communicate with such "smart" controllers to facilitate the detection that the PV system is a compliant USB charging port that may be used with the intended device. In one embodiment, the USB input connector may be modified to interface with the "smart" controller to help it distinguish or determine that it is attached to the proper USB compliant charging port or a dedicated charging port (DCP). This mathematical communication from the PV system may be necessary for the intended device to believe whether the port is a DCP. The intended device outputs a nominal 0.6 V output on its D− line and handshakes the voltage input on its D+ line. The intended device concludes it is connected to an alternate Standard Downstream Port (SDP) if the data line being read is less than the nominal data detect voltage of 0.3 V. The intended device concludes it is connected to a DCP if the data line being read is within a voltage range of 0.3V to 0.8 V. Should the intended device conclude that it is connected to a DCP, the intended device will allow current to be drawn from the PV system at an increased rate, and undergo a "fast charge" at the maximum acceptable rated current.

Figure 45:
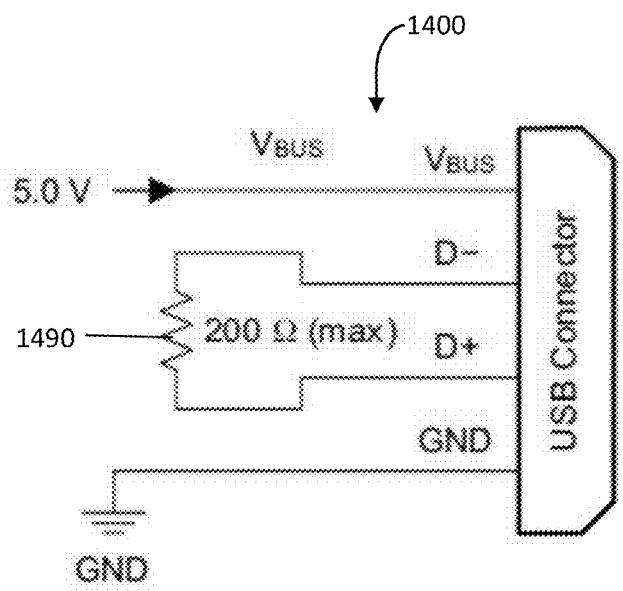
FIG. 45 illustrates one embodiment of a traditional method to interface with "smart" controllers by shorting the data lines with impedance.

One USB connector modification that can enable this communication of DCP identity may be accomplished by shorting the D+ line to the D− line 1490. FIG. 45 represents how the USB cable connector and its wires 1400 of FIG. 41B could be configured within a PV system's junction box. FIG. 41B illustrates a typical shorting process that requires a maximum impedance to short the wires. In one embodiment, the shorting of the D+ and D− wires will omit any impedance between the wires. The shorting of the D+ line to the D− line may be done by soldering together, or a combination of ways that is standard in the industry without any resistance required. This direct shorting of the two data lines allows the PV system to be directly coupled to the intended device, and interface with the "smart" controller for proper mathematical algorithm determination that the optimized PV system is a DCP. The optimized PV panel may deliver the full amperage that it was designed or matched to the intended device, where the intended device can be charged safely and quickly.

Alternatively, the USB connector may be optionally modified to accept various voltage signals from the optimized PV system to enable communication of a different charging port identity (i.e. divider DCP, CDP, an SDP, an ACA, and/or an ACA-Dock). The PV system may be properly adjusted using the mathematical algorithms to cut a plurality of tiles or the subcells to match the intended portable electronic device charging port type. The PV system may emit or output at least one voltage signal through at least one of the data lines to facilitate the determination that it is connected to a divider DCP, a standard dedicated port (SDP), a charging downstream Port (CDP), and/or an accessory charger adaptor (ACA). The "smart" controllers recognition of the optimized PV system provided identity, allows the portable electronic device to undergo a "fast charge" at the maximum acceptable rated current.

Incorporation By Reference

The entire disclosure of each of the publications, patent documents, and other references referred to herein is incorporated herein by reference in its entirety for all purposes to the same extent as if each individual source were individually denoted as being incorporated by reference.

Equivalents

The invention may be embodied in other specific forms without departing from the spirit or essential characteristics thereof. The foregoing embodiments are therefore to be considered in all respects illustrative rather than limiting on the invention described herein. The true scope of the invention is thus indicated by the descriptions contained herein, as well as all changes that come within the meaning and ranges of equivalency thereof.

The invention claimed is:

1. A method of providing a directly coupled, power conditioned photovoltaic system including a plurality of tiles for charging a smart-enabled electronic device via a Universal Serial Bus ("USB ")port, the smart-enabled electronic device having at least one signal carrying data line for identifying the USB port type, comprising:
    identifying a charging voltage range to initiate a charging sequence and a charging current that can be accepted by the smart-enabled electronic device;
    selecting at least one solar cell, the at least one solar cell having an output voltage and a current per unit area;
    quantifying a minimum number of tiles formed from the at least one solar cell necessary to create an output voltage for the plurality of tiles that falls within the charging voltage range;
    using the current per unit area to calculate a desired surface area for each of the plurality of tiles such that each of the plurality of tiles generates a tile current that approximates the charging current;
    cutting the plurality of tiles from the at least one solar cell, each of the plurality of tiles having a tile surface area that approximates the desired surface area;
    stringing together the plurality of tiles to have the output voltage for the plurality of tiles that falls within the charging voltage range and an output current for the plurality of tiles that approximates the charging current;
    encapsulating the strung plurality of tiles between at least a first material layer and at least a second material layer;
    attaching an output connection to the strung plurality of tiles, the output connection including a USB connector suitable for directly connecting to the USB port of the smart-enabled electronic device;
    identifying at least one signal for the at least one signal carrying data line that permits the smart-enabled electronic device to accept the charging current; and
    providing the at least one signal to the at least one signal carrying data line.

2. The method of claim 1, wherein the step of providing the at least one signal to the at least one signal carrying data line comprises shorting the at least one signal carrying data line.

3. The method of claim 1, wherein the step of providing the at least one signal to the at least one signal carrying data line comprises incorporating a resistor having a series impedance of less than 200 ohms into the at least one signal carrying data line.

4. The method of claim 1, wherein the step of providing the at least one signal to the at least one signal carrying data line characterizes the at least one signal carrying data line as a member selected from the group consisting of a dedicated charging port (DCP), a standard downstream port (SDP), a charging downstream port (CDP), and any combination thereof.

5. The method of claim 1, wherein the smart-enabled electronic device is selected from a group consisting of a mobile phone, a tablet, a laptop, a smart phone, a digital camera, an MP3 player, a personal data assistant (PDA), and any combination thereof.

6. The method of claim 1, wherein the output connection comprises a junction box.

\* \* \* \* \*